US012671554B2

(12) United States Patent
Shellhammer et al.

(10) Patent No.: US 12,671,554 B2
(45) Date of Patent: Jun. 30, 2026

(54) RANGING NULL DATA PACKETS FOR WIDE BANDWIDTH NETWORKS

(71) Applicant: QUALCOMM Incorporated, San Diego, CA (US)

(72) Inventors: Stephen Jay Shellhammer, Ramona, CA (US); Bin Tian, San Diego, CA (US); Alireza Raissinia, Monte Sereno, CA (US); Yanjun Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 460 days.

(21) Appl. No.: 18/054,531

(22) Filed: Nov. 10, 2022

(65) Prior Publication Data

US 2024/0163059 A1 May 16, 2024

(51) Int. Cl.
*H04L 5/00* (2006.01)
*H03M 13/00* (2006.01)
*H04L 69/22* (2022.01)

(52) U.S. Cl.
CPC ...... *H04L 5/0053* (2013.01); *H03M 13/6312* (2013.01); *H04L 5/0064* (2013.01); *H04L 69/22* (2013.01)

(58) Field of Classification Search
CPC .. H03M 13/6312; H04L 27/34; H04L 5/0005; H04L 5/0044; H04L 5/0048; H04L 5/0053; H04L 5/0064; H04L 5/0094; H04L 69/22
See application file for complete search history.

(56) References Cited

U.S. PATENT DOCUMENTS

| | | | |
|---|---|---|---|
| 2019/0045508 A1* | 2/2019 | Cariou | H04W 72/0446 |
| 2020/0037395 A1* | 1/2020 | Ko | H04W 80/08 |
| 2020/0132857 A1* | 4/2020 | Berger | H04W 64/003 |
| 2022/0078792 A1* | 3/2022 | Jeon | H04W 72/0453 |
| 2022/0345349 A1* | 10/2022 | Kim | H04L 27/26132 |

(Continued)

OTHER PUBLICATIONS

Mengshi, Hu, et. al. "Preamble Structure and SIG Contents" Huawei Technologies; IEEE 802.11-20/0029r3. Jan. 2020. https://mentor.ieee.org/802.11/dcn/20/11-20-0029-03-00be-preamble-structure-and-sig-contents.pptx (Year: 2020).*

(Continued)

*Primary Examiner* — Stephen J Clawson
(74) *Attorney, Agent, or Firm* — Holland & Hart LLP

(57) ABSTRACT

This disclosure provides methods, components, devices and systems for ranging measurement procedures between two wireless devices that communicate in wide bandwidth networks. Some aspects more specifically relate to null data packet (NDP) transmissions via a 320 megahertz (MHz) bandwidth. In some examples, a first wireless device and a second wireless device may participate in a ranging measurement procedure and may exchange one or more NDPs to facilitate distance measurements and one or both of the first wireless device and the second wireless device may indicate that an associated protocol data unit (PDU) is a 320 MHz ranging NDP (e.g., an NDP of a ranging variant associated with a bandwidth of 320 MHz) via one or more bits of the preamble of the PDU. The one or more bits may be included in a universal signal (U-SIG) field of the preamble of the PDU.

27 Claims, 14 Drawing Sheets

1000

(56)         References Cited

U.S. PATENT DOCUMENTS

| | | | | |
|---|---|---|---|---|
| 2022/0346115 A1* | 10/2022 | Bhanage | ............... | H04W 72/21 |
| 2023/0337025 A1* | 10/2023 | Sun | ........................ | G01S 13/765 |
| 2023/0370237 A1* | 11/2023 | Ding | .................... | H04B 7/0417 |
| 2024/0049157 A1* | 2/2024 | Feng | ........................ | G01S 7/006 |
| 2024/0284505 A1* | 8/2024 | Epstein | ................. | H04L 5/0053 |
| 2024/0380516 A1* | 11/2024 | Wu | ...................... | H04L 1/0069 |

OTHER PUBLICATIONS

IEEE: "P802.11az™M/D4.1 Draft Standard for Information Technology—Telecommunications and Information Exchange Between Systems Local and Metropolitan Area Networks-Specific Requirements, Part 11: Wireless Lan Medium Access Control (Mac) and Physical Layer (Phy) Specifications, Amendment 4: Enhancements for Positioning", IEEE Draft, Draft P802.11AZ_D4.1_Redline_compared_TO_D4.0, IEEE-SA, Piscataway, NJ USA, vol. 802.11az drafts, No. D4.1, Feb. 7, 2022, pp. 1-288, XP068191581, pp. 1-203, pp. 233-250.

International Search Report and Written Opinion—PCT/US2023/077864—ISA/EPO—Feb. 7, 2024 (2300639WO).

Shellhammer (Qualcomm) S., et al., "NDP Selection for 802.11bf", 11-22-0415-02-00BF-NDP-Selection-for-802-11BF, IEEE-SA Mentor, Piscataway, NJ USA, vol. 802.11bf, No. 2, Mar. 17, 2022, pp. 1-12, XP068189732, p. 3.

\* cited by examiner

600

700

Octet Stream
605

Octet Parser

610

615-a 620-a

Modulator

Punctured 80 MHz
Segment (Dropped
Data)

615-b 620-b

Modulator

2ⁿᵈ Lowest 80
MHz Sequence 615-c 620-c

Modulator

2ⁿᵈ Highest 80
MHz Sequence 615-d 620-d

Modulator

Highest 80 MHz
Sequence

800

900

1100

1102

Transmit a first physical layer PDU, where the first physical layer PDU is associated with a bandwidth that is greater than 160 MHz, and where a preamble of the first physical layer PDU includes a first set of bits that indicates that the first physical layer PDU is a first ranging NDP

1104

Receive a second physical layer PDU, where the second physical layer PDU is associated with the bandwidth that is greater than 160 MHz, and where a preamble of the second physical layer PDU includes a second set of bits that indicates that the second physical layer PDU is a second ranging NDP

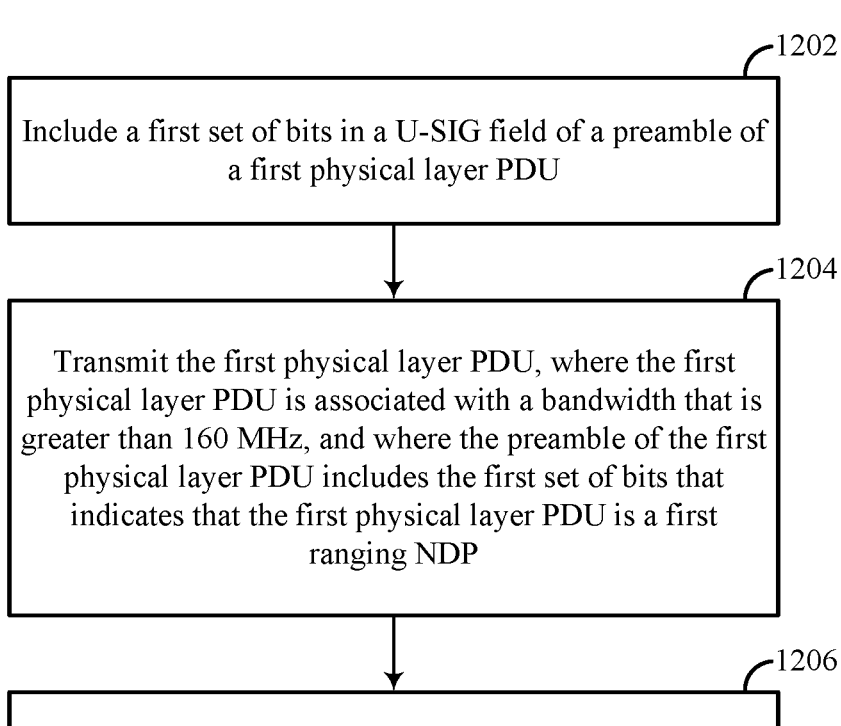

┌─────────────────────────────────────────────┐ 1202
│ Include a first set of bits in a U-SIG field of a preamble of │
│ a first physical layer PDU │
└─────────────────────────────────────────────┘

┌─────────────────────────────────────────────┐ 1204
│ Transmit the first physical layer PDU, where the first │
│ physical layer PDU is associated with a bandwidth that is │
│ greater than 160 MHz, and where the preamble of the first │
│ physical layer PDU includes the first set of bits that │
│ indicates that the first physical layer PDU is a first │
│ ranging NDP │
└─────────────────────────────────────────────┘

┌─────────────────────────────────────────────┐ 1206
│ Receive a second physical layer PDU, where the second │
│ physical layer PDU is associated with the bandwidth that │
│ is greater than 160 MHz, and where a preamble of the │
│ second physical layer PDU includes a second set of bits │
│ that indicates that the second physical layer PDU is a │
│ second ranging NDP │
└─────────────────────────────────────────────┘

1302

Transmit a first physical layer PDU, where the first physical layer PDU is associated with a bandwidth that is greater than 160 MHz, and where a preamble of the first physical layer PDU includes a first set of bits that indicates that the first physical layer PDU is a first ranging NDP

1304

Receive a second physical layer PDU, where the second physical layer PDU is associated with the bandwidth that is greater than 160 MHz, and where a preamble of the second physical layer PDU includes a second set of bits that indicates that the second physical layer PDU is a second ranging NDP

1306

Communicating in association with a measurement report, where the measurement report is based on transmission of the first physical layer PDU and reception of the second physical layer PDU, and where the measurement report includes an indication of a distance between the first wireless communication device and a second wireless communication device from which the second physical layer PDU is received

PPDU Transmission Component

1402

PPDU Reception Component

1404

PPDU Preamble Generation Component

1406

PPDU Interpretation Component

1408

Ranging Component

1410

Measurement Report Component

1412

RANGING NULL DATA PACKETS FOR WIDE BANDWIDTH NETWORKS

TECHNICAL FIELD

The following relates to wireless communications, including ranging null data packets (NDPs) for wide bandwidth networks.

DESCRIPTION OF THE RELATED TECHNOLOGY

A wireless local area network (WLAN) may be formed by one or more wireless access points (APs) that provide a shared wireless communication medium for use by multiple client devices also referred to as wireless stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

In some WLANs, two or more wireless devices may exchange signaling to measure a distance between pairs of the two or more wireless devices.

SUMMARY

The systems, methods and devices of this disclosure each have several innovative aspects, no single one of which is solely responsible for the desirable attributes disclosed herein.

One innovative aspect of the subject matter described in this disclosure can be implemented in a first wireless communication device. The first wireless communication device may include a processor, memory coupled with the processor, and instructions stored in the memory. The instructions may be executable by the processor to cause the first wireless communication device to transmit a first physical layer protocol data unit (PDU), where the first physical layer PDU is associated with a bandwidth that is greater than 160 megahertz (MHz), and where a preamble of the first physical layer PDU includes a first set of bits that indicates that the first physical layer PDU is a first ranging null data packet (NDP), and receive a second physical layer PDU, where the second physical layer PDU is associated with the bandwidth that is greater than 160 MHz, and where a preamble of the second physical layer PDU includes a second set of bits that indicates that the second physical layer PDU is a second ranging NDP.

Another innovative aspect of the subject matter described in this disclosure can be implemented in a method for wireless communication performable at a first wireless communication device. The method may include transmitting a first physical layer PDU, where the first physical layer PDU is associated with a bandwidth that is greater than 160 MHz, and where a preamble of the first physical layer PDU includes a first set of bits that indicates that the first physical layer PDU is a first ranging NDP, and receiving a second physical layer PDU, where the second physical layer PDU is associated with the bandwidth that is greater than 160 MHz, and where a preamble of the second physical layer PDU includes a second set of bits that indicates that the second physical layer PDU is a second ranging NDP.

Another innovative aspect of the subject matter described in this disclosure can be implemented in an apparatus for wireless communication at a first wireless communication device. The apparatus may include means for transmitting a first physical layer PDU, where the first physical layer PDU is associated with a bandwidth that is greater than 160 MHz, and where a preamble of the first physical layer PDU includes a first set of bits that indicates that the first physical layer PDU is a first ranging NDP, and means for receiving a second physical layer PDU, where the second physical layer PDU is associated with the bandwidth that is greater than 160 MHz, and where a preamble of the second physical layer PDU includes a second set of bits that indicates that the second physical layer PDU is a second ranging NDP.

Another innovative aspect of the subject matter described in this disclosure can be implemented in a non-transitory computer-readable medium storing code for wireless communication at a first wireless communication device. The code may include instructions executable by a processor to transmit a first physical layer PDU, where the first physical layer PDU is associated with a bandwidth that is greater than 160 MHz, and where a preamble of the first physical layer PDU includes a first set of bits that indicates that the first physical layer PDU is a first ranging NDP, and receive a second physical layer PDU, where the second physical layer PDU is associated with the bandwidth that is greater than 160 MHz, and where a preamble of the second physical layer PDU includes a second set of bits that indicates that the second physical layer PDU is a second ranging NDP.

In some examples, the methods and wireless communication devices may further include operations, features, means, or instructions for including the first set of bits in a universal signal (U-SIG) field of the preamble of the first physical layer PDU.

In some examples of the methods and wireless communication devices, including the first set of bits in the U-SIG field of the preamble of the first physical layer PDU may include operations, features, means, or instructions for using one or more reserved bits of the U-SIG field for indicating that the first physical layer PDU may be the first ranging NDP, the one or more reserved bits being within one or more of multiple parts of the U-SIG field and being designated, at least for a first type of station (STA) that may be different from a type of the first wireless communication device, as either one or more disregard bits or one or more validate bits.

In some examples of the methods and wireless communication devices, including the first set of bits in the U-SIG field of the preamble of the first physical layer PDU may include operations, features, means, or instructions for using one or more bits of a type and compression mode field of the U-SIG field for indicating that the first physical layer PDU may be the first ranging NDP.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIGS. 11 through 13 show flowcharts illustrating example processes performable by a wireless device that support ranging NDPs for wide bandwidth networks in accordance with one or more aspects of the present disclosure.

Like reference numbers and designations in the various drawings indicate like elements.

DETAILED DESCRIPTION

Figure 1:
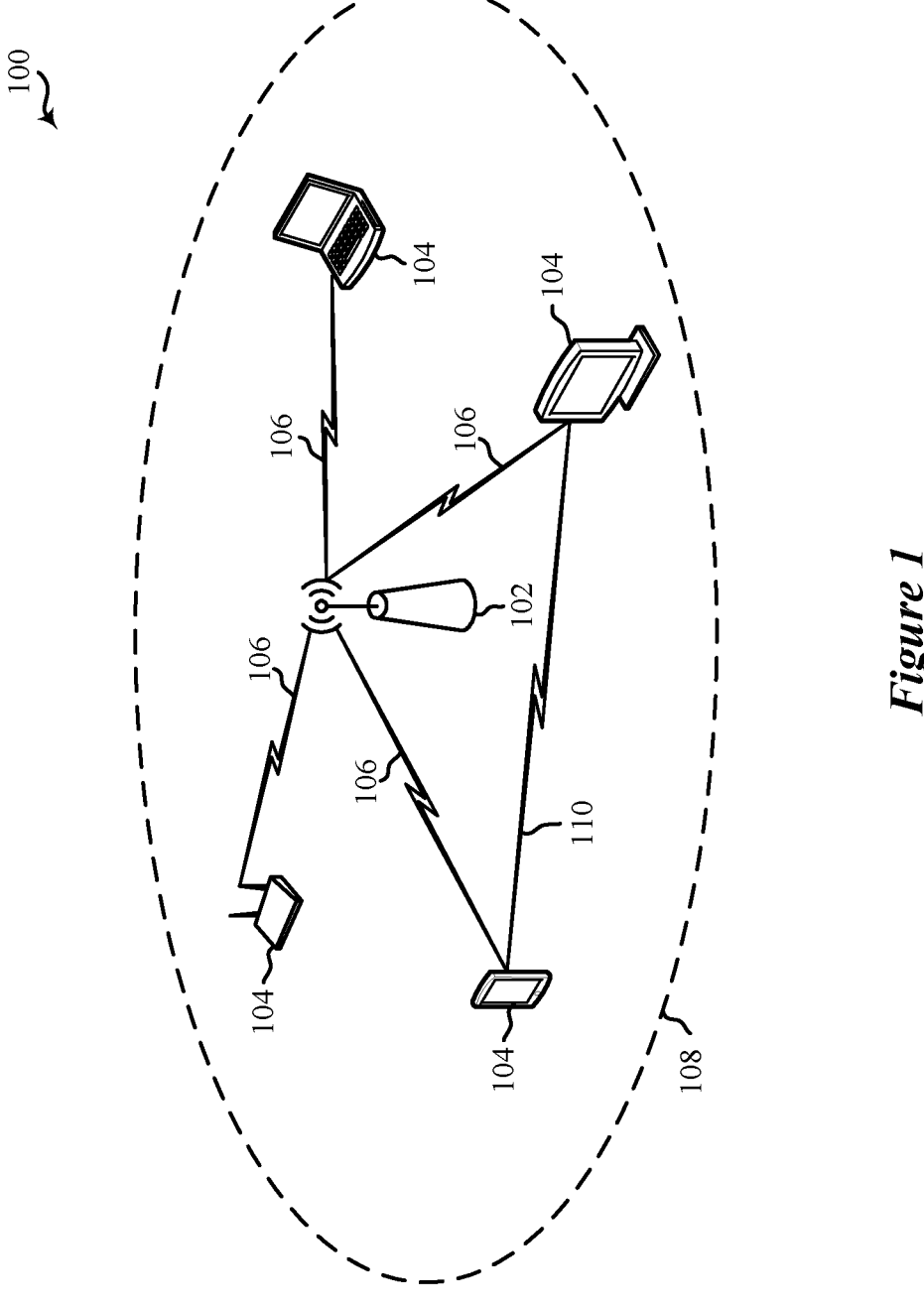
FIG. 1 shows a pictorial diagram of an example wireless communication network.

The following description is directed to some particular examples for the purposes of describing innovative aspects of this disclosure. However, a person having ordinary skill in the art will readily recognize that the teachings herein can be applied in a multitude of different ways. Some or all of the described examples may be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3rd Generation Partnership Project (3GPP), among others. The described examples can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), spatial division multiple access (SDMA), rate-splitting multiple access (RSMA), multi-user shared access (MUSA), single-user (SU) multiple-input multiple-output (MIMO) and multi-user (MU)-MIMO. The described examples also can be implemented using other wireless communication protocols or RF signals suitable for use in one or more of a wireless personal area network (WPAN), a wireless local area network (WLAN), a wireless wide area network (WWAN), a wireless metropolitan area network (WMAN), or an internet of things (IOT) network.

Various aspects relate generally to ranging measurement procedures between two wireless devices that communicate in wide bandwidth networks. Some aspects more specifically relate to null data packet (NDP) transmissions via a 320 megahertz (MHz) bandwidth. In some examples, a first wireless device and a second wireless device may participate in a ranging measurement procedure and may exchange one or more NDPs to facilitate distance measurements or estimations between the first wireless device and the second wireless device. In some implementations, one or both of the first wireless device and the second wireless device may indicate that an associated protocol data unit (PDU) is a ranging NDP (e.g., an NDP of a ranging variant) via one or more bits of the preamble of the PDU. For example, one or both of the first wireless device and the second wireless device may use one or more bits in a preamble of a PDU, such as a physical layer convergence protocol (PLCP) PDU (PPDU), to indicate that the PDU (which may be a 320 MHz PPDU or a PPDU that is otherwise associated with a bandwidth of 320 MHz) is a ranging NDP. In some implementations, the first wireless device or the second wireless device may use one or more bits in a universal signal (U-SIG) field of the PDU to indicate that the PDU is a 320 MHz ranging PDU. In such implementations, the one or more bits may be located in a first part of the U-SIG field (e.g., U-SIG-1) or in a second part of the U-SIG field (e.g., U-SIG-2). The one or more bits may include one or more bits that may otherwise be used or interpreted as disregard bits, validate bits, or bits of a type and compression mode field. As such, the first wireless device and the second wireless device may support one or more interpretation rules associated with (e.g., exclusive or specific to) at least some PDU variants or types. For example, for Extremely High Throughput (EHT) PDUs, the first wireless device and the second wireless device may support an interpretation rule according to which the first wireless device and the second wireless device may determine, identify, or otherwise ascertain that a PDU (associated with a 320 MHz bandwidth) is a ranging NDP based on one or more bits in a preamble of the PDU.

Particular aspects of the subject matter described in this disclosure can be implemented to realize one or more of the following potential advantages. In some examples, by supporting an indication that a PDU is a ranging NDP within a preamble of the PDU itself, the described techniques can be used to support greater or more accessible system knowledge and greater feasibility of EHT ranging measurement. For example, in accordance with including an indication that the PDU is a ranging PDU within the PDU itself, other wireless devices (e.g., other stations (STAs) or a sniffer device) within the system may detect or otherwise identify that the PDU is a ranging NDP and such greater or more accessible system knowledge may be usable to achieve greater system efficiency or lower signaling overhead. Further, the described techniques simplify ranging measurement for EHT devices, which may lead to greater deployment of EHT-capable devices within a given system. Such a system may accordingly experience more accurate ranging (as wider bandwidth ranging signaling may provide more accurate ranging-related information), higher data rates, and greater spectral efficiency, among other benefits.

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2020 specification or amendments thereof including, but not limited to, 802.11ay, 802.11ax, 802.11az, 802.11ba, 802.11bd, 802.11be, 802.11bf, and the 802.11 amendment associated with Wi-Fi 8). The WLAN 100 may include numerous wireless communication devices such as a wireless AP 102 and multiple wireless STAs 104. While only one AP 102 is shown in FIG. 1, the WLAN 100 also can include multiple APs 102. AP 102 shown in FIG. 1 can represent various different types of APs including but not limited to enterprise-level APs, single-frequency APs, dual-band APs, standalone APs, software-enabled APs (soft APs), and multi-link APs. The coverage area and capacity of a cellular network (such as LTE, 5G NR, etc.) can be further improved by a small cell which is supported by an AP serving as a miniature base station. Furthermore, private cellular networks also can be set up through a wireless area network using small cells.

Each of the STAs 104 also may be referred to as a mobile station (MS), a mobile device, a mobile handset, a wireless handset, an access terminal (AT), a user equipment (UE), a subscriber station (SS), or a subscriber unit, among other examples. The STAs 104 may represent various devices such as mobile phones, personal digital assistant (PDAs), other handheld devices, netbooks, notebook computers, tablet computers, laptops, chromebooks, extended reality (XR) headsets, wearable devices, display devices (for example, TVs (including smart TVs), computer monitors, navigation systems, among others), music or other audio or stereo devices, remote control devices ("remotes"), printers, kitchen appliances (including smart refrigerators) or other household appliances, key fobs (for example, for passive keyless entry and start (PKES) systems), Internet of Things (IoT) devices, and vehicles, among other examples. The various STAs 104 in the network are able to communicate with one another via the AP 102.

A single AP 102 and an associated set of STAs 104 may be referred to as a basic service set (BSS), which is managed by the respective AP 102. FIG. 1 additionally shows an example coverage area 108 of the AP 102, which may represent a basic service area (BSA) of the WLAN 100. The BSS may be identified or indicated to users by a service set identifier (SSID), as well as to other devices by a basic service set identifier (BSSID), which may be a medium access control (MAC) address of the AP 102. The AP 102 may periodically broadcast beacon frames ("beacons") including the BSSID to enable any STAs 104 within wireless range of the AP 102 to "associate" or re-associate with the AP 102 to establish a respective communication link 106 (hereinafter also referred to as a "Wi-Fi link"), or to maintain a communication link 106, with the AP 102. For example, the beacons can include an identification or indication of a primary channel used by the respective AP 102 as well as a timing synchronization function for establishing or maintaining timing synchronization with the AP 102. The AP 102 may provide access to external networks to various STAs 104 in the WLAN via respective communication links 106.

To establish a communication link 106 with an AP 102, each of the STAs 104 is configured to perform passive or active scanning operations ("scans") on frequency channels in one or more frequency bands (for example, the 2.4 GHz, 5 GHz, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (μs)). To perform active scanning, a STA 104 generates and sequentially transmits probe requests on each channel to be scanned and listens for probe responses from APs 102. Each STA 104 may identify, determine, ascertain, or select an AP 102 with which to associate in accordance with the scanning information obtained through the passive or active scans, and to perform authentication and association operations to establish a communication link 106 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) networks. In some cases, ad hoc networks may be implemented within a larger wireless network such as the WLAN 100. In such examples, while the STAs 104 may be capable of communicating with each other through the AP 102 using communication links 106, STAs 104 also can communicate directly with each other via direct wireless communication links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless communication links 110 include Wi-Fi Direct connections, connections established by using a Wi-Fi Tunneled Direct Link Setup (TDLS) link, and other P2P group connections.

The APs 102 and STAs 104 may function and communicate (via the respective communication links 106) according to one or more of the IEEE 802.11 family of wireless communication protocol standards. These standards define the WLAN radio and baseband protocols for the physical (PHY) and MAC layers. The APs 102 and STAs 104 transmit and receive wireless communications (hereinafter also referred to as "Wi-Fi communications" or "wireless packets") to and from one another in the form of PHY protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some examples of the APs 102 and STAs 104 described herein also may communicate in other frequency bands, such as the 5.9 GHz and the 6 GHz bands, which may support both licensed and unlicensed communications. The APs 102 and STAs 104 also can communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac, 802.11ax and 802.11be standard amendments may be transmitted over the 2.4 GHz, 5 GHz or 6 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHz, 80 MHz, 160 or 320 MHz by bonding together multiple 20 MHz channels.

Each PPDU is a composite structure that includes a PHY preamble and a payload in the form of a PHY service data unit (SPUD). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is associated with the particular IEEE 802.11 protocol to be used to transmit the payload.

In accordance with example implementations of the present disclosure, a first wireless device (e.g., an AP 102 or a STA 104) and a second wireless device (e.g., an AP 102 or a STA 104) may participate in a ranging measurement procedure and may exchange one or more NDPs to facilitate distance measurements or estimations between the first wireless device and the second wireless device and, in some implementations, one or both of the first wireless device and the second wireless device may indicate that an associated PDU is a ranging NDP (e.g., an NDP of a ranging variant) via one or more bits of the preamble of the PDU. For example, one or both of the first wireless device and the second wireless device may use one or more bits in a preamble of a PDU, such as a PPDU, to indicate that the PDU (which may be a 320 MHz PPDU or a PPDU that is otherwise associated with a bandwidth of 320 MHz) is a ranging NDP. In some implementations, the first wireless device or the second wireless device may use one or more bits in a universal signal (U-SIG) field of the PDU. In such implementations, the one or more bits may be located in a first part of the U-SIG field (e.g., U-SIG-1) or in a second part of the U-SIG field (e.g., U-SIG-2).

Figure 2:
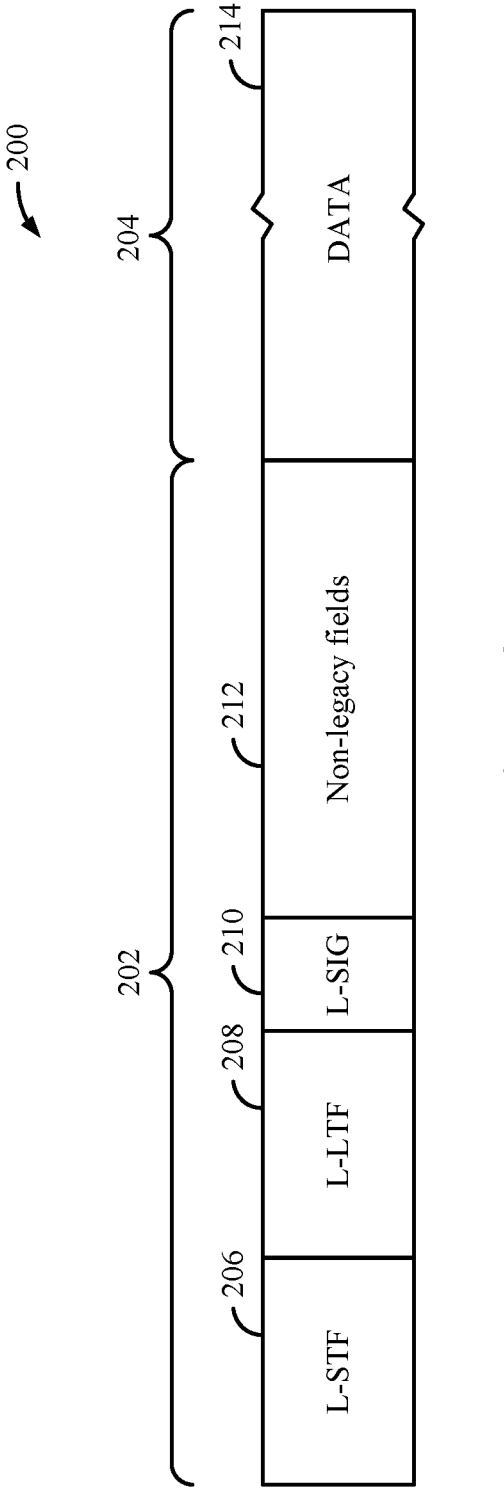
FIG. 2 shows an example protocol data unit (PDU) usable for communications between a wireless access point and one or more wireless stations.

FIG. 2 shows an example PDU 200 usable for wireless communication between a wireless AP 102 and one or more wireless STAs 104. For example, the PDU 200 can be configured as a PPDU. As shown, the PDU 200 includes a PHY preamble 202 and a PHY payload 204. For example, the preamble 202 may include a legacy portion that itself includes a legacy short training field (L-STF) 206, which may include two symbols, a legacy long training field (L-LTF) 208, which may include two symbols, and a legacy signal field (L-SIG) 210, which may include two symbols. The legacy portion of the preamble 202 may be configured according to the IEEE 802.11a wireless communication protocol standard. The preamble 202 also may include a non-legacy portion including one or more non-legacy fields 212, for example, conforming to one or more of the IEEE 802.11 family of wireless communication protocol standards.

The L-STF 206 generally enables a receiving device to perform coarse timing and frequency tracking and automatic gain control (AGC). The L-LTF 208 generally enables a receiving device to perform fine timing and frequency tracking and also to perform an initial estimate of the wireless channel. The L-SIG 210 generally enables a receiving device to determine (for example, obtain, select, identify, detect, ascertain, calculate, or compute) a duration of the PDU and to use the determined duration to avoid transmitting on top of the PDU. The legacy portion of the preamble, including the L-STF 206, the L-LTF 208 and the L-SIG 210, may be modulated according to a binary phase shift keying (BPSK) modulation scheme. The payload 204 may be modulated according to a BPSK modulation scheme, a quadrature BPSK (Q-BPSK) modulation scheme, a quadrature amplitude modulation (QAM) modulation scheme, or another appropriate modulation scheme. The payload 204 may include a PSDU including a data field (DATA) 214 that, in turn, may carry higher layer data, for example, in the form of MAC protocol data units (MPDUs) or an aggregated MPDU (A-MPDU).

In accordance with example implementations of the present disclosure, a first wireless device (e.g., an AP 102 or a STA 104) and a second wireless device (e.g., an AP 102 or a STA 104) may participate in a ranging measurement procedure and may exchange one or more NDPs to facilitate distance measurements or estimations between the first wireless device and the second wireless device and, in some implementations, one or both of the first wireless device and the second wireless device may indicate that an associated PDU 200 is a ranging NDP (e.g., an NDP of a ranging variant) via one or more bits of the preamble 202 of the PDU 200. For example, one or both of the first wireless device and the second wireless device may use one or more bits in a preamble 202 of a PDU 200 to indicate that the PDU 200 is or includes a ranging NDP. In some implementations, the first wireless device or the second wireless device may use one or more bits in a U-SIG field of the preamble 202 of the PDU 200. In such implementations, the one or more bits may be located in a first part of the U-SIG field (e.g., U-SIG-1) or in a second part of the U-SIG field (e.g., U-SIG-2). The U-SIG field of the preamble 202 may be included in the one or more non-legacy fields 212.

Figure 3:
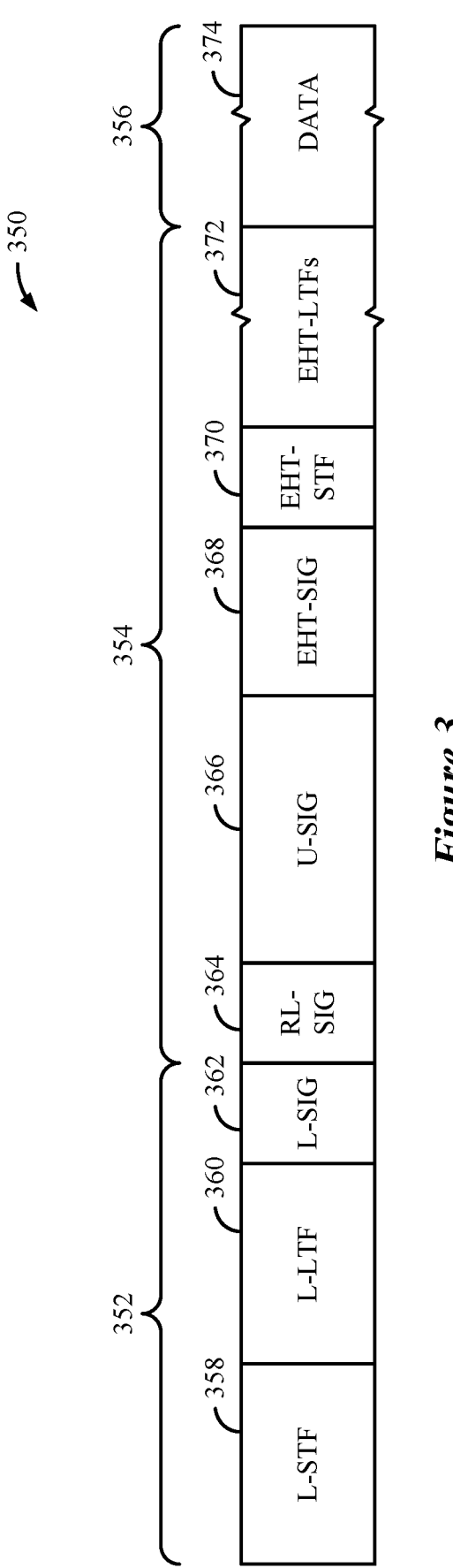
FIG. 3 shows an example physical layer (PHY) protocol data unit (PPDU) usable for communications between a wireless access point (AP) and one or more wireless stations (STAs).

FIG. 3 shows another example PPDU 350 usable for wireless communication between a wireless AP and one or more wireless STAs. The PPDU 350 may be used for SU, OFDMA or MU-MIMO transmissions. The PPDU 350 may be formatted as an EHT WLAN PPDU in accordance with the IEEE 802.11be amendment to the IEEE 802.11 family of wireless communication protocol standards, or may be formatted as a PPDU conforming to any later (post-EHT) version of a new wireless communication protocol conforming to a future IEEE 802.11 wireless communication protocol standard, such as the 802.11 amendment associated with Wi-Fi 8), or another wireless communication standard. The PPDU 350 includes a PHY preamble including a legacy portion 352 and a non-legacy portion 354. The PPDU 350 may further include a PHY payload 356 after the preamble, for example, in the form of a PSDU including a data field 374.

The legacy portion 352 of the preamble includes an L-STF 358, an L-LTF 360, and an L-SIG 362. The non-legacy portion 354 of the preamble includes a repetition of L-SIG (RL-SIG) 364 and multiple wireless communication protocol version-dependent signal fields after RL-SIG 364. For example, the non-legacy portion 354 may include a universal signal (U-SIG) field 366 (referred to herein as "U-SIG 366") and an EHT signal field 368 (referred to herein as "EHT-SIG 368"). The presence of RL-SIG 364 and U-SIG 366 may indicate to EHT- or later version-compliant STAs 104 that the PPDU 350 is an EHT PPDU or a PPDU conforming to any later (post-EHT) version of a new wireless communication protocol conforming to a future IEEE 802.11 wireless communication protocol standard. One or both of U-SIG 366 and EHT-SIG 368 may be structured as, and carry version-dependent information for, other wireless communication protocol versions associated with amendments to the IEEE family of standards beyond EHT. For example, U-SIG 366 may be used by a receiving device to interpret bits in one or more of EHT-SIG 368 or the data field 374. Like L-STF 358, L-LTF 360, and L-SIG 362, the information in U-SIG 366 and EHT-SIG 368 may be duplicated and transmitted in each of the component 20 MHz channels in instances involving the use of a bonded channel.

The non-legacy portion 354 further includes an additional short training field 370 (referred to herein as "EHT-STF 370," although it may be structured as, and carry version-dependent information for, other wireless communication protocol versions beyond EHT) and one or more additional long training fields 372 (referred to herein as "EHT-LTFs 372," although they may be structured as, and carry version-dependent information for, other wireless communication protocol versions beyond EHT). EHT-STF 370 may be used for timing and frequency tracking and AGC, and EHT-LTF 372 may be used for more refined channel estimation.

EHT-SIG 368 may be used by an AP to identify and inform one or multiple STAs 104 that the AP has scheduled UL or DL resources for them. EHT-SIG 368 may be decoded by each compatible STA 104 served by the AP 102. EHT-SIG 368 may generally be used by a receiving device to interpret bits in the data field 374. For example, EHT-SIG 368 may include RU allocation information, spatial stream configuration information, and per-user (for example, STA-specific) signaling information. Each EHT-SIG 368 may include a common field and at least one user-specific field. In the context of OFDMA, the common field can indicate RU distributions to multiple STAs 104, indicate the RU assignments in the frequency domain, indicate which RUs are allocated for MU-MIMO transmissions and which RUs correspond to OFDMA transmissions, and the number (e.g., quantity) of users in allocations, among other examples. The user-specific fields are assigned to particular STAs 104 and carry STA-specific scheduling information such as user-specific MCS values and user-specific RU allocation information. Such information enables the respective STAs 104 to identify and decode corresponding RUs in the associated data field 374.

In some wireless communications environments, EHT systems or other systems compliant with future generations of the IEEE 802.11 family of wireless communication protocol standards may provide additional capabilities over other previous systems (for example, High Efficiency (HE) systems or other legacy systems). EHT and newer wireless communication protocols may support flexible operating bandwidth enhancements at APs and STAs, such as broadened operating bandwidths relative to legacy operating bandwidths or more granular operation relative to legacy operation. For example, an EHT system may allow communications spanning operating bandwidths of 20 MHz, 40 MHz, 80 MHz, 160 MHz, 240 MHz and 320 MHz. EHT systems may support multiple bandwidth modes such as a contiguous 240 MHz bandwidth mode, a contiguous 320 MHz bandwidth mode, a noncontiguous 160+160 MHz bandwidth mode, or a noncontiguous 80+80+80+80 (or "4×80") MHz bandwidth mode.

In some examples in which a wireless communication device operates in a contiguous 320 MHz bandwidth mode or a 160+160 MHz bandwidth mode. Signals for transmission may be generated by two different transmit chains of the device each having a bandwidth of 160 MHz (and each coupled to a different power amplifier). In some other examples, signals for transmission may be generated by four or more different transmit chains of the device, each having a bandwidth of 80 MHz.

In some other examples, the wireless communication device may operate in a contiguous 240 MHz bandwidth mode, or a noncontiguous 160+80 MHz bandwidth mode. In some examples, the signals for transmission may be generated by three different transmit chains of the device, each having a bandwidth of 80 MHz. In some other examples, the 240 MHz/160+80 MHz bandwidth modes may also be formed by puncturing 320/160+160 MHz bandwidth modes with one or more 80 MHz subchannels. For example, signals for transmission may be generated by two different transmit chains of the device each having a bandwidth of 160 MHz with one of the transmit chains outputting a signal having an 80 MHz subchannel punctured therein.

The operating bandwidth also may accommodate concurrent operation on other unlicensed frequency bands (such as the 6 GHz band) and a portion of spectrum that includes frequency bands traditionally used by Wi-Fi technology. In noncontiguous examples, the operating bandwidth may span one or more disparate sub-channel sets. For example, the 320 MHz bandwidth may be contiguous and located in the same 6 GHz band or noncontiguous and located in different bands (such as partly in the 5 GHz band and partly in the 6 GHz band).

In some examples, operability enhancements associated with EHT and newer generations of the IEEE 802.11 family of wireless communication protocols, and in particular operation at an increased bandwidth, may include refinements to carrier sensing and signal reporting mechanisms. Such techniques may include modifications to existing rules, structure, or signaling implemented for legacy systems.

In accordance with example implementations of the present disclosure, a first wireless device (e.g., an AP 102 or a STA 104) and a second wireless device (e.g., an AP 102 or a STA 104) may participate in a ranging measurement procedure and may exchange one or more NDPs to facilitate distance measurements or estimations between the first wireless device and the second wireless device. In some implementations, one or both of the first wireless device and the second wireless device may indicate that an associated PPDU 350 is a ranging NDP (e.g., an NDP of a ranging variant) via one or more bits of a non-legacy portion 354 of the PHY preamble of the PPDU 350. For example, one or both of the first wireless device and the second wireless device may use one or more bits in the U-SIG 366 of the PPDU 350 to indicate that the PPDU 350 is or includes a ranging NDP. In such implementations, the one or more bits may be located in a first part of the U-SIG 366 (e.g., U-SIG-1) or in a second part of the U-SIG 366 (e.g., U-SIG-2).

In some aspects, a multi-user (MU) PPDU preamble may be used for a non-TB NDP and, in some systems, there may be a field in the MU PPDU preamble that indicates if the PPDU 350 is an NDP. Such a field may include a PPDU type and compression mode field in the U-SIG 366. In some examples, the PPDU type and compression mode field may be included in a second part of the U-SIG 366, which may be referred to as U-SIG-2. The PPDU type and compression mode field may include two bits and, in some cases, may occupy bits B0 and B1 of the U-SIG-2.

An interpretation of the PPDU type and compression mode field may be associated with or defined on a value of an uplink/downlink (UL/DL) field. For example, if the UL/DL field is set to 0, a value of 0 for the PPDU type and compression mode field may indicate a downlink OFDMA transmission, a value of 1 for the PPDU type and compression mode field may indicate a transmission to a single user or an EHT sounding NDP, a value of 2 for the PPDU type and compression mode field may indicate a non-OFDMA downlink MU-MIMO transmission, and a value of 3 for the PPDU type and compression mode field may indicate or be associated with a validate indication. If the UL/DL field is set to 1, a value of 1 for the PPDU type and compression mode field may indicate a transmission to a single user or an EHT sounding NDP and values of 2 or 3 for the PPDU type and compression mode field may indicate or be associated with a validate indication. Further, a value of 0 for the PPDU type and compression mode field may indicate a TB PPDU.

As such, to indicate or identify a non-TB ranging NDP in a 320 MHz preamble, there may be one or more unused values of some fields and there may also be one or more reserved bits (e.g., which may include one or both of "validate" bits and "disregard" bits) in the U-SIG 366 of the MU PPDU and, in some implementations, a wireless device may use any of such fields or bits to indicate that the PPDU 350 is a 320 MHz ranging NDP. In some implementations, for example, a wireless device may use some "validate" values (e.g., a value of 3) to indicate that the PPDU 350 is a 320 MHz ranging NDP.

Additionally, or alternatively, there may be one or more other disregard and validate bits that a wireless device may use to indicate that the PPDU 350 is a 320 MHz ranging NDP. Such one or more other bits may be located within a first of multiple parts of the U-SIG 366 or in a second of multiple parts of the U-SIG 366. In implementations, in which the one or more bits are located within the first of the multiple parts of the U-SIG 366 (e.g., U-SIG-1), the wireless device may use bits B20-B24 (which may otherwise be associated with disregard bits) or bit B25 (which may otherwise be associated with a validate bit), or any combination or subset thereof. In implementations in which the one or more bits are located within the second of the multiple parts of the U-SIG 366 (e.g., U-SIG-2), the wireless device may use bit B2 (which may otherwise be associated with an extension of a PPDU type and compression mode field) or a bit B8 (which may otherwise be associated with a validate bit), or any combination thereof.

Further, to indicate or identify a TB ranging NDP in a 320 MHz preamble, a wireless device may use or modify one or more bits of the U-SIG 366 in the EHT TB PPDU preamble to indicate that the PPDU 350 is a 320 MHz ranging NDP. To signal or indicate that the PPDU 350 is a 320 MHz ranging NDP, a wireless device may use one or more bits of the U-SIG 366. Such one or more other bits may be located within a first of multiple parts of the U-SIG 366 or in a second of multiple parts of the U-SIG 366. In implementations, in which the one or more bits are located within the first of the multiple parts of the U-SIG 366 (e.g., U-SIG-1), the wireless device may use bits B20-B25 (which may otherwise be associated with disregard bits), or any subset thereof. In implementations in which the one or more bits are located within the second of the multiple parts of the U-SIG 366 (e.g., U-SIG-2), the wireless device may use bit B2 (which may otherwise be associated with a validate bit) or bits B11-B15 (which may otherwise be associated with disregard bits), or any combination or subset thereof.

Additionally, or alternatively, a wireless device may use a PPDU type and compression mode field to indicate that the PPDU 350 is a 320 MHz ranging NDP. Some systems may define that a PPDU type and compression mode field is set to 0 for EHT TB PPDUs, and the field may be set to 1 for NDP or for a transmission to a single user. In some aspects, such an NDP or single user transmission corresponding to a PPDU type and compression mode field value of 1 may not be a TB PPDU but rather a transmission that is not in response to a trigger frame. As such, a wireless device may use two other possible values (e.g., word values) of the PPDU type and compression mode field (e.g., values 2 and 3, which may otherwise be reserved or associated with a validate indication) to indicate or signal that the PPDU 350 is a TB ranging NDP that has a 320 MHz bandwidth. Alternatively, a wireless device may set the PPDU type and compression mode field to 1 for the uplink case (e.g., to indicate that the PPDU 350 is a 320 MHz ranging PPDU sent via uplink).

Figure 4:
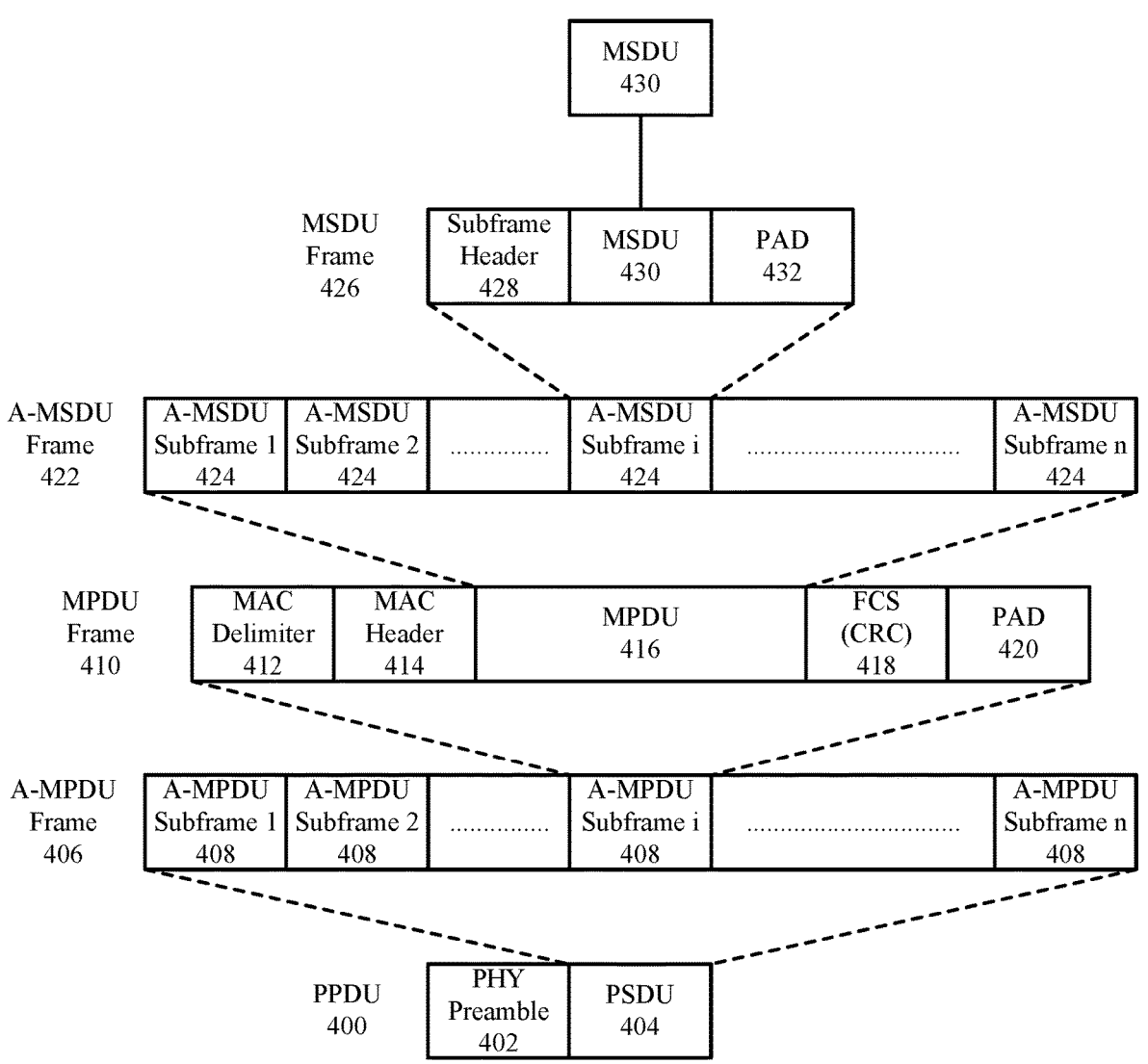
FIG. 4 shows a hierarchical format of an example PPDU usable for communications between a wireless AP and one or more wireless STAs.

FIG. 4 shows a hierarchical format of an example PPDU usable for communications between a wireless AP 102 and one or more wireless STAs 104. As described, each PPDU 400 includes a PHY preamble 402 and a PSDU 404. Each PSDU 404 may represent (or "carry") one or more MAC protocol data units (MPDUs) 416. For example, each PSDU 404 may carry an aggregated MPDU (A-MPDU) 406 that includes an aggregation of multiple A-MPDU subframes 408. Each A-MPDU subframe 406 may include an MPDU frame 410 that includes a MAC delimiter 412 and a MAC header 414 prior to the accompanying MPDU 416, which includes the data portion ("payload" or "frame body") of the MPDU frame 410. Each MPDU frame 410 also may include a frame check sequence (FCS) field 418 for error detection (for example, the FCS field may include a cyclic redundancy check (CRC)) and padding bits 420. The MPDU 416 may carry one or more MAC service data units (MSDUs) 430 via one or more MSU frames 426. For example, the MPDU 416 may carry an aggregated MSDU (A-MSDU) frame 422 including multiple A-MSDU subframes 424. Each A-MSDU subframe 424 contains a corresponding MSDU 430 preceded by a subframe header 428 and in some cases followed by padding bits 432.

Referring back to the MPDU frame 410, the MAC delimiter 412 may serve as a marker of the start of the associated MPDU 416 and indicate the length of the associated MPDU 416. The MAC header 414 may include multiple fields containing information that defines or indicates characteristics or attributes of data encapsulated within the MPDU 416 (e.g., within a frame body of the MPDU 416). The MAC header 414 includes a duration field indicating a duration extending from the end of the PPDU until at least the end of an acknowledgment (ACK) or Block ACK (BA) of the PPDU that is to be transmitted by the receiving wireless communication device. The use of the duration field serves to reserve the wireless medium for the indicated duration, and enables the receiving device to establish its network allocation vector (NAV). The MAC header 414 also includes one or more fields indicating addresses for the data encapsulated within the MPDU 416. For example, the MAC header 414 may include a combination of a source address, a transmitter address, a receiver address or a destination address. The MAC header 414 may further include a frame control field containing control information. The frame control field may specify a frame type, for example, a data frame, a control frame, or a management frame.

In accordance with example implementations of the present disclosure, a first wireless device (e.g., an AP 102 or a STA 104) and a second wireless device (e.g., an AP 102 or a STA 104) may participate in a ranging measurement procedure and may exchange one or more NDPs to facilitate distance measurements or estimations between the first wireless device and the second wireless device. In some implementations, one or both of the first wireless device and the second wireless device may indicate that an associated PPDU 400 is a ranging NDP (e.g., an NDP of a ranging variant) via one or more bits of a non-legacy portion of the PHY preamble 402 of the PPDU 400. For example, one or both of the first wireless device and the second wireless device may use one or more bits in a U-SIG field of the PPDU 400 to indicate that the PPDU 400 is or includes a ranging NDP. In such implementations, the one or more bits may be located in a first part of the U-SIG field (e.g., U-SIG-1) or in a second part of the U-SIG field (e.g., U-SIG-2).

Figure 5:
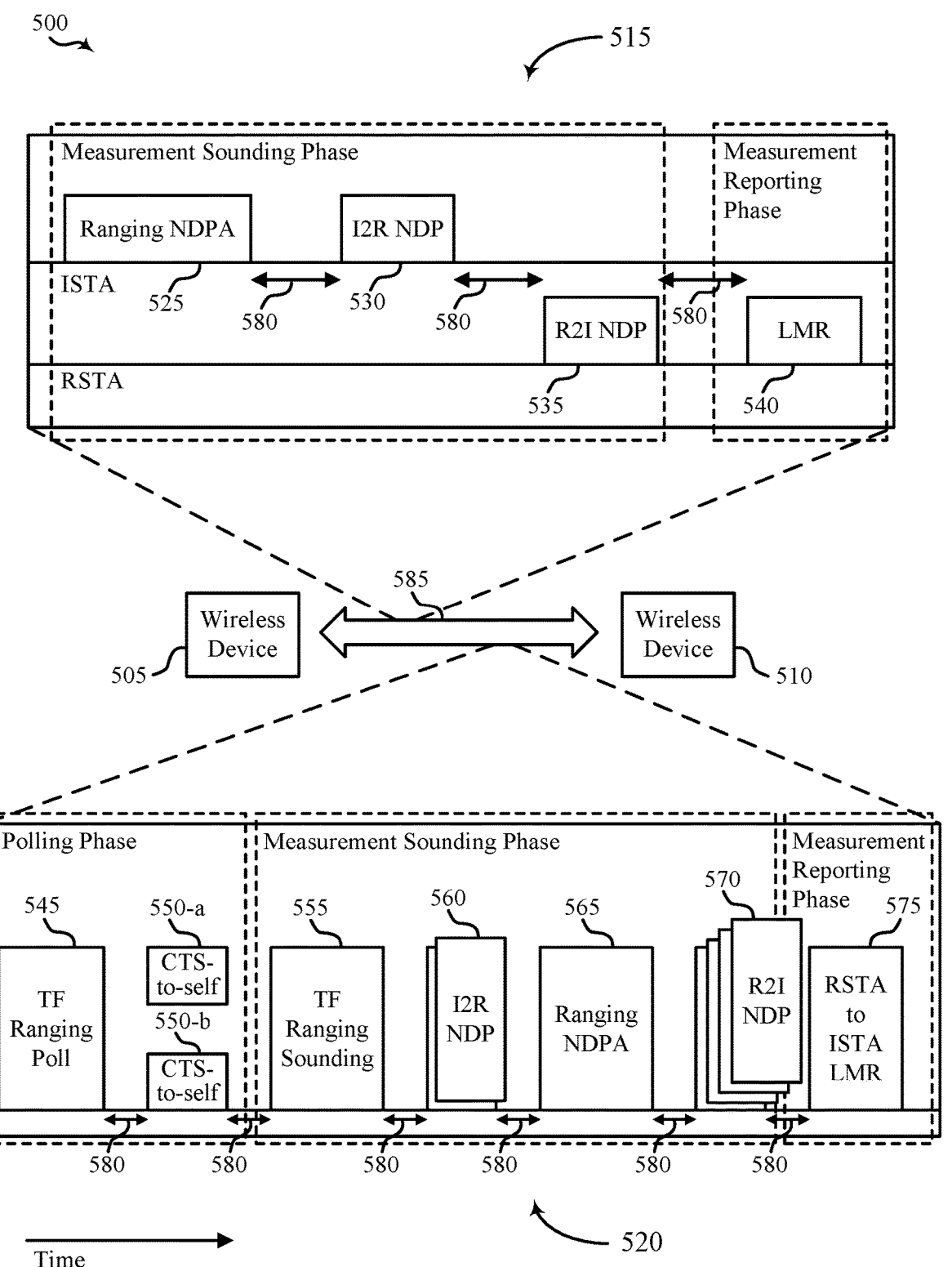
FIG. 5 shows an example diagram that supports ranging null data packets (NDPs) for wide bandwidth networks in accordance with one or more aspects of the present disclosure.

FIG. 5 shows an example diagram 500 that supports ranging NDPs for wide bandwidth networks in accordance with one or more aspects of the present disclosure. The diagram 500 may implement or be implemented to realize or facilitate aspects of the WLAN 100, the PDU 200, the PPDU 350, or the PPDU 400. For example, the diagram 500 illustrates communication between a wireless device 505 and a wireless device 510 via a communication link 585, and the wireless device 505 and the wireless device 510 may each be an example of a STA 104 or an AP 102 as illustrated by and described with reference to FIG. 1. In some implementations, the wireless device 505 and the wireless device 510 may support one or more signaling or messaging designs to support a ranging measurement procedure involving a transmission of ranging NDPs using a bandwidth that is greater than 160 MHz. For example, the bandwidth may be a 320 MHz bandwidth, as a 320 MHz bandwidth may offer a better resolution than a 160 MHz bandwidth (where such a resolution may refer to a time domain resolution and may facilitate a more accurate round-trip-time (RTT) measurement, which may lead to more accurate range measurement resolution). In some aspects, the wireless device 505 may be an initiating STA (ISTA) and the wireless device 510 may be a responding STA (RSTA). Alternatively, the wireless device 510 may be an ISTA and the wireless device 505 may be a RSTA. Further, although referred to as an ISTA or an RSTA, such a role of ISTA or RSTA may be taken by either a STA 104 or an AP 102.

To support a ranging measurement procedure, the wireless device 505 and the wireless device 510 may employ a non-trigger-based (TB) ranging measurement exchange sequence 515 or a trigger-based (TB) ranging measurement exchange sequence 520. In scenarios in which the wireless device 505 and the wireless device 510 employ the non-TB ranging measurement exchange sequence 515, an ISTA (e.g., one of the wireless device 505 and the wireless device 510) may transmit a ranging NDPA frame 525 and may transmit one or more ISTA to RSTA (I2R) NDPs 530. An RSTA (e.g., the other of the wireless device 505 and the wireless device 510) may respond by transmitting one or more RSTA to ISTA (R2I) NDPs 535 and a location measurement report (LMR) 540. For example, the RSTA may measure an RTT associated with the I2R NDPs 530 and the R2I NDPs 535, may determine or estimate a range or distance between the ISTA and the RSTA based on the RTT, and may include an indication of the range or distance in the LMR 540 transmitted to the ISTA. The ISTA and the RSTA may communicate the ranging NDPA frame, the one or more I2R NDPs 530, and the R2I NDPs 535 during a measurement sounding phase and may communicate the LMR 540 during a measurement reporting phase. In some aspects, the ISTA and the RSTA may wait a gap 580 between successive signaling within the non-TB ranging measurement exchange sequence 515. In some aspects, the gap 580 may be associated with a short interframe space (SIFS).

In scenarios in which the wireless device 505 and the wireless device 510 employ the TB ranging measurement exchange sequence 520, an RSTA may transmit a trigger frame for ranging poll 545 to one or more ISTAs and the one or more ISTAs may accordingly transmit a clear-to-send (CTS)-to-self message 550. For example, a first ISTA may transmit a CTS-to-self message 550-a and a second ISTA may transmit CTS-to-self message 550-b. In some aspects, the RSTA and the one or more ISTAs may communicate the trigger frame for ranging poll 545 and the CTS-to-self messages 550 during a polling phase. The RSTA may transmit a trigger frame for ranging sounding 555 to trigger the ranging measurement procedure between the RSTA and the one or more ISTAs. The one or more ISTAs may transmit one or more I2R NDPs 560 to the RSTA and may further transmit a ranging NDPA frame 565 and associated R2I NDPs 570 to the one or more ISTAs.

In accordance with the TB ranging measurement exchange sequence 520, the RSTA and the one or more ISTAs may support one or more waveform types to improve a reliability of the NDPs and may support scalability by point-to-multipoint measurement such that multiple STAs 104 or APs 102 can measure the distance. In other words, the wireless device 505 and the wireless device 510 may support a trigger-based sequence to support a multi-user (MU) deployment. In some aspects, the RSTA and the one or more ISTAs may communicate the trigger frame for ranging sounding 555, the one or more I2R NDPs 560, the ranging NDPA frame 565, and the one or more R2I NDPs 570 during a measurement sounding phase. The RSTA may transmit an RSTA to ISTA LMR 575 during a measurement reporting phase. In some aspects, each RSTA may measure an RTT associated with the at least one of the one or more I2R NDPs 560 and at least one of the one or more R2I NDPs 570, and may determine or estimate a distance based on the RTT measurement. In some aspects, the RSTA and the one or more ISTAs may wait a gap 580 between successive signaling within the TB ranging measurement exchange sequence 520. In some aspects, the gap 580 may be associated with a SIFS.

In some systems, devices may support ranging NDPs up to 160 MHz. Relatively wider bandwidths (e.g., relatively larger bandwidths, such as bandwidths greater than 160 MHz, such as 320 MHz), however, may provide greater ranging accuracy or resolution. Accordingly, in some implementations, the wireless device 505 and the wireless device 510 may expand one or more frames and procedures associated with a ranging measurement procedure (using either or both of the non-TB ranging measurement exchange sequence or the TB ranging measurement exchange sequence) to support 320 MHz. In some implementations, for instance, the wireless device 505 and the wireless device 510 may support options to indicate a 320 MHz bandwidth in one or more messages associated with a medium access control (MAC) layer. For example, the wireless device 505 and the wireless device 510 may support options to indicate a 320 MHz bandwidth in one or more of a ranging NDPA or a ranging trigger frame (e.g., including one or more ranging trigger frame variants, such as for polling, sounding, secure sounding, reporting, or passive sounding). Additionally, or alternatively, the wireless device 505 and the wireless device 510 may support options to indicate a 320 MHz bandwidth in one or more messages associated with a PHY layer. For example, the wireless device 505 and the wireless device 510 may use a 320 MHz bandwidth for one or more of an I2R NDP, an R2I NDP, or secure long training field (LTF).

Further, the wireless device 505 and the wireless device 510 may support one or more select puncturing modes or patterns associated with a bandwidth that is greater than 160 MHz (e.g., 240 MHz with contiguous bandwidth). For example, some geographic regions may have a limited amount of bandwidth (e.g., may have 240 MHz of available bandwidth), but a bandwidth that may still offer greater accuracy than a 160 MHz bandwidth. Accordingly, in some implementations, the wireless device 505 and the wireless device 510 may select which puncturing modes or patterns to support, determine how to enable ranging NDPA frames with 320 MHz, determine how to enable a trigger frame for ranging poll or sounding with 320 MHz, determine how to expand session negotiation with IFTMR or IFTM frames, determine how to expand ranging NDPs for 320 MHz, or any combination thereof.

In some aspects, a 320 MHz EHT preamble may be used for a 320 MHz ranging NDP. Further, there may be two different types of 320 MHz ranging NDPs including a 320 MHz non-TB ranging NDP (which may use an EHT multiuser (MU) PPDU preamble) and a 320 MHz TB NDP (which may use an EHT TB PPDU preamble). In some systems, EHT signaling may support a non-TB NDP that does not support ranging and, in such systems, EHT signaling may not support some types of TB NDPs. To support both TB and non-TB ranging NDPs, the wireless device 505 and the wireless device 510 may distinguish between a non-ranging NDP and a ranging NDP, or between a data PPDU and a ranging NDP, via information included in a preamble of the PPDU carrying or including the ranging NDP. In other words, it may be useful to indicate, via the preamble of a PPDU associated with a TB ranging NDP, that the PPDU is a ranging NPD and not a data PPDU. Similarly, it may be useful to indicate, via the preamble of a PPDU associated with a non-TB ranging NDP, that the PPDU is a ranging NDP and not another type of NDP. Further, while a NDPA frame may include an indication that the PPDU is a ranging NDP, including such information in the preamble of the PPDU itself may be useful for other STAs or sniffer devices in the system, as such other devices may be able to decode the preamble of the PPDU and identify the type of the PPDU during over-the-air transmission.

As described herein, a ranging NDP may be a type of NDP that is exchanged between wireless devices (e.g., the wireless device 505 and the wireless device 510) as part of a ranging measurement procedure, which may refer to a procedure via which at least one of the wireless devices calculates, estimates, measures, or otherwise determines a distance between the wireless devices. Such a ranging NDP may be distinguished from other types of NDPs that are not used for such ranging or sounding. Additional details relating to the indication or identification of a ranging NDP via a preamble of a PPDU are illustrated by and described with reference to FIG. 3.

Additionally, or alternatively, the wireless device 505 and the wireless device 510 may support a design for one or more ranging NDPs (e.g., ranging NDP enhancements) that facilitates a use of 320 MHz for the ranging NDPs for a ranging measurement procedure between the wireless device 505 and the wireless device 510. For example, the wireless device 505 and the wireless device 510 may support secure ranging (e.g., using secure EHT-LTFs) and, to support secure ranging, may use a counter mode in the PHY layer to generate a pseudo random sequence of octets at both a transmitter and a receiver. For secure NDPs, the transmitting device may use a segment parser to parse secure octets between lower and upper segments and, in some implementations, the transmitting device may extend such a segment parser to support 320 MHz secure NDPs.

In some implementations, for example, the wireless device 505 and the wireless device 510 may expand a segment parser to handle a 320 MHz bandwidth with and without puncturing. In some aspects, for instance, the wireless device 505 and the wireless device 510 may employ a four-way segment parser for 320 MHz without puncturing. Additionally, or alternatively, the wireless device 505 and the wireless device 510 may support a three-way segment parser for 320 MHz with one 80 MHz sub-block punctured. The wireless device 505 and the wireless device 510 may employ such four-way and three-way segment parsers for 320 MHz to parse segments in the frequency order (e.g., such that sub-blocks or segments of an NDP are ordered from a relatively highest frequency allocation to a relatively lowest frequency allocation) to maintain simplicity and to support backward compatibility. In some aspects, the wireless device 505 and the wireless device 510 may expand that concept to other puncturing patterns, such as for a 200 MHz or 280 MHz occupied bandwidth after puncturing. For example, the wireless device 505 and the wireless device 510 may employ a modified four-way segment parser to support 40 MHz puncturing for 320 MHz ranging NDPs.

In some aspects, 320 MHz ranging NDPs may support some preamble puncturing modes, such as all or a subset of a set of possible preamble puncturing modes available (e.g., in EHT). An EHT PHY may support a set of (e.g., 25) puncturing patterns for an 320 MHz NDP and one of the set of puncturing patterns may be signaled or indicated in a punctured channel information field of a U-SIG field. An EHT PHY may support puncturing modes of no puncturing, puncturing of any 40 MHz segment, puncturing of any 80 MHz segment, or some combinations of 40 MHz puncturing and 80 MHz puncturing. A punctured pattern field (which may indicate puncturing by resource unit (RU) or multiple RU (MRU) index) may indicate a puncturing pattern via different field values, where different field values (which may range from a value of 0 to a value of 24) correspond to different puncturing patterns.

In an example of implementations in which the wireless device 505 and the wireless device 510 support a design for one or more ranging NDPs that facilitates a use of 320 MHz for the ranging NDPs for a ranging measurement procedure between the wireless device 505 and the wireless device 510, the wireless device 505 may generate, for a ranging measurement procedure between the wireless device 505 and the wireless device 510, a sequence of pseudo random octets associated with one or more ranging NDPs, a bandwidth of the one or more ranging NDPs being greater than 160 MHz. The wireless device 505 may segment the sequence of pseudo random octets into multiple sequence segments based on the bandwidth of the one or more ranging NDPs and an indication of a presence of a puncturing pattern that is associated with the bandwidth of the one or more ranging NDPs being greater than 160 MHz. The wireless device 505 may transmit, to the wireless device 510, the one or more ranging NDPs based on segmenting the sequence of pseudo-random octets into the multiple sequence segments and may determine a distance between the wireless device 505 and the wireless device 510 based on the one or more ranging NDPs. For example, the wireless device 505 may transmit, to the wireless device 510, another set of one or more ranging NDPs and may determine the distance based on an RTT associated with the different sets of ranging NDPs. Additional details relating to such a design for one or more ranging NDPs that facilitates a use of 320 MHz for the ranging NDPs for a ranging measurement procedure are illustrated by and described with reference to FIGS. 6 through 9.

Figure 6:
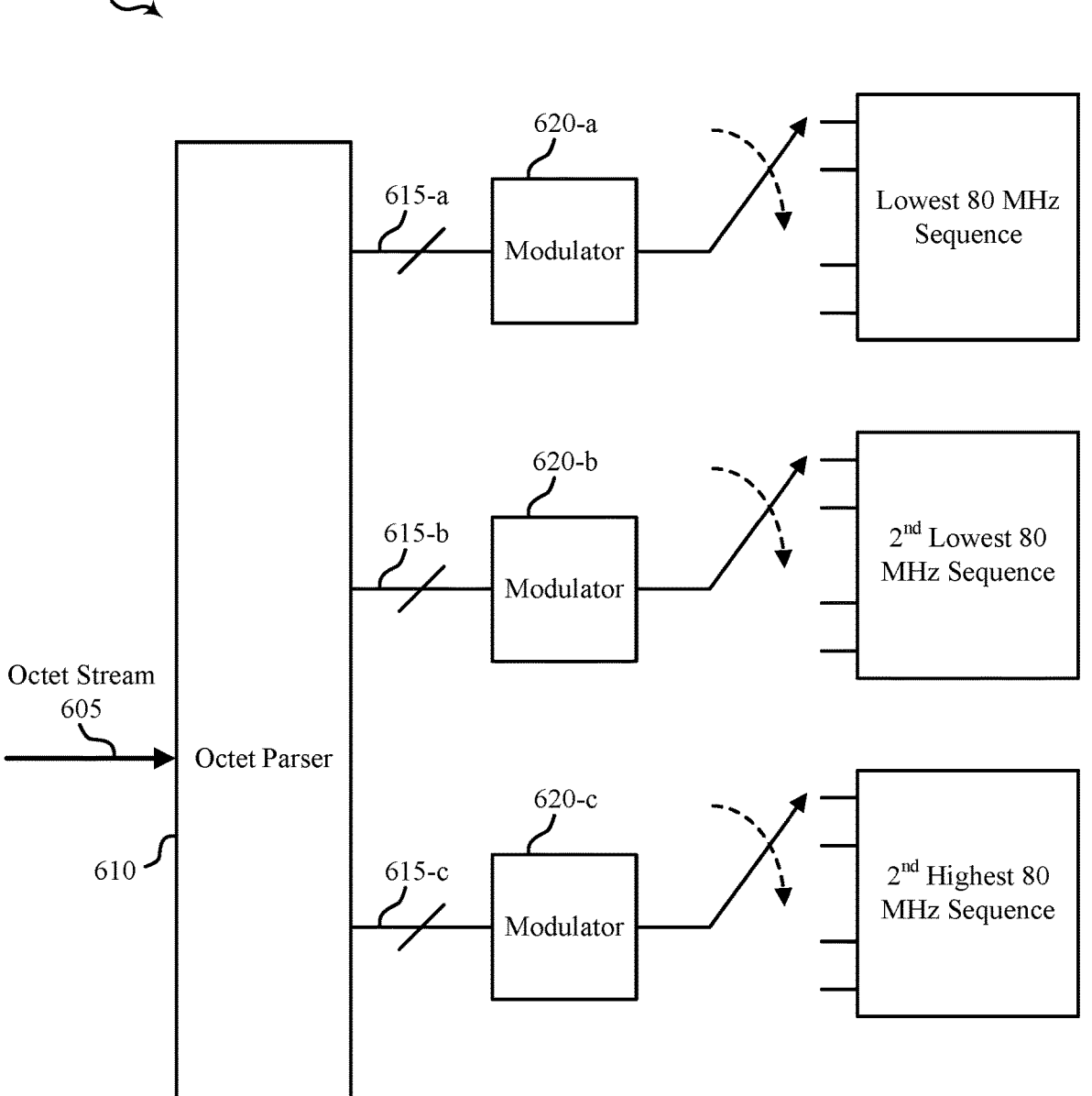
FIGS. 6 through 9 show example segmentation diagrams that support ranging NDPs for wide bandwidth networks in accordance with one or more aspects of the present disclosure.

FIG. 6 shows an example segmentation diagram 600 that supports ranging NDPs for wide bandwidth networks in accordance with one or more aspects of the present disclosure. The segmentation diagram 600 may support a transmission or reception technique for ranging NDPs that use a 320 MHz bandwidth and may support a use of EHT ranging NDPs with secure EHT-LTFs. For example, the wireless device 505 and the wireless device 510 may use a counter mode (e.g., an AES-128 counter mode) in the PHY layer to generate a pseudo random sequence of octets at both the transmitter and the receiver and may use the pseudo random sequence of octets for one or more ranging NDPs.

In some aspects, an AES-128 counter mode may be reset at a beginning of each secure EHT NDP using a new key provided over a secure link. At the beginning of the secure NDP, a first set of pseudo random octets may be used to apply a per-stream pseudo random phase rotation. Further, for 20 MHz, 40 MHz, and 80 MHz secure NDPs, the remaining pseudo random octets may be used to construct a pseudo random 64-quadrature amplitude modulation (QAM) for each of the 2×LTF tones, from a relatively lowest frequency tone within a frequency allocation to a relatively highest frequency tone within the frequency allocation.

Further, in some aspects and for 160 MHz secure NDPs, a segment parser may be used to parse the secure octets between lower and upper segments. For example, for an octet stream associated with 160 MHz, a transmitting device may use a segment parser to obtain two segments including a first segment and a second segment. The transmitting device may pass each segment through a 64QAM modulator and allocate an output of the modulation of each segment to frequency tones of different 80 MHz sequences or segments. For example, the transmitting device may modulate the first segment to obtain a modulated first segment and may allocate the modulated first segment to frequency tones (which may be associated index values ranging from 500 to −500) of a lower 80 MHz sequence. The transmitting device may modulate the second segment to obtain a modulated second segment and may allocate the modulated second segment to frequency tones (which may be associated with index values ranging from 500 to −500) of an upper 80 MHz sequence. In other words, the transmitting device may employ a segment parser for distributing pseudo random octets to the sequences for the lower and upper 80 MHz segments in the 160 MHz secure LTF.

In some implementations, and as illustrated by the segmentation diagram 600, a transmitting device may support a different segment parsing technique for handling secure LTFs in scenarios in which the transmitting device transmits one or more ranging NDPs using a bandwidth greater than 160 MHz (e.g., a 320 MHz bandwidth). For example, the transmitting device may generate an octet stream 605 of pseudo random octets (e.g., a sequence of pseudo random octets) and may pass the octet stream 605 into an octet parser 610. The transmitting device may obtain a quantity of outputs 615 from the octet parser 610 and may modulate each output 615 using a modulator 620 (e.g., a 64QAM modulator). For example, the transmitting device may modulate an output 615-*a* using a modulator 620-*a*, modulate an output 615-*b* using a modulator 620-*b*, modulate an output 615-*c* using a modulator 620-*c*, and may modulate an output 615-*d* using a modulator 620-*d*.

The transmitting device may allocate each of the modulated outputs 615 to different frequency ranges (e.g., different sequence segments) within the bandwidth (e.g., within the allocated 320 MHz bandwidth). For example, the transmitting device may allocate information of the modulated output 615-*a* to frequency domain tones of a relatively lowest 80 MHz sequence segment, allocate information of the modulated output 615-*b* to frequency domain tones of a second lowest 80 MHz sequence segment, allocate information of the modulated output 615-*c* to frequency domain tones of a second highest 80 MHz sequence segment, and allocate information of the modulated output 615-*d* to frequency domain tones of a relatively highest 80 MHz sequence segment. In other words, the transmitting device may allocate, for each of the quantity of outputs, information of an output to frequency domain tones of a respective sequence segment.

Accordingly, in implementations associated with the segmentation diagram 600, the wireless device 505 and the wireless device 510 may exchange ranging NDPs using a 320 MHz bandwidth without puncturing (e.g., the wireless device 505 and the wireless device 510 may use the full 320 MHz bandwidth). As such, the segmentation diagram 600 may be referred to as a four-way segment parser for 320 MHz which may support a 320 MHz operating bandwidth.

Figure 7:

FIG. 7 shows an example segmentation diagram 700 that supports ranging NDPs for wide bandwidth networks in accordance with one or more aspects of the present disclosure. The segmentation diagram 700 may support a transmission or reception technique for ranging NDPs that use a 320 MHz bandwidth and may support a use of EHT ranging NDPs with secure EHT-LTFs. For example, the wireless device 505 and the wireless device 510 may use a counter mode (e.g., an AES-128 counter mode) in the PHY layer to generate a pseudo random sequence of octets at both the transmitter and the receiver and may use the pseudo random sequence of octets for one or more ranging NDPs.

In some implementations, such as implementations in which the wireless device 505 and the wireless device 510 use a puncturing pattern for ranging NDPs that is associated with a 320 MHz bandwidth, the wireless device 505 and the wireless device 510 may support a three-way segment parser for 240 MHz. For example, instead of allocating four outputs from the octet parser 610 and allocating the four outputs to different 80 MHz sequence segments (such that a 320 MHz bandwidth is fully utilized), a transmitting device may obtain three outputs from the octet parser 610 and may allocate each of the three outputs to different 80 MHz segments (such that a 240 MHz portion of a 320 MHz bandwidth is utilized).

Accordingly, and as illustrated by the segmentation diagram 700, a transmitting device may obtain the output 615-*b*, the output 615-*c*, and the output 615-*d* from the octet parser 610, may modulate each of the three obtained outputs 615 via respective modulators 620, and may allocate information of each modulated output 615 to frequency domain tones of respective 80 MHz sequence segments. As illustrated by the segmentation diagram 700, the wireless device 505 and the wireless device 510 may puncture the relatively lowest 80 MHz sequence segment. Further, although illustrated in the context of the segmentation diagram 700 as puncturing the relatively lowest 80 MHz sequence segment, the wireless device 505 and the wireless device 510 may support any puncturing pattern such that any one or more of second lowest 80 MHz sequence segment, the second highest 80 MHz sequence segment, or the highest 80 MHz sequence segment may additionally, or alternately, be punctured.

Figure 8:
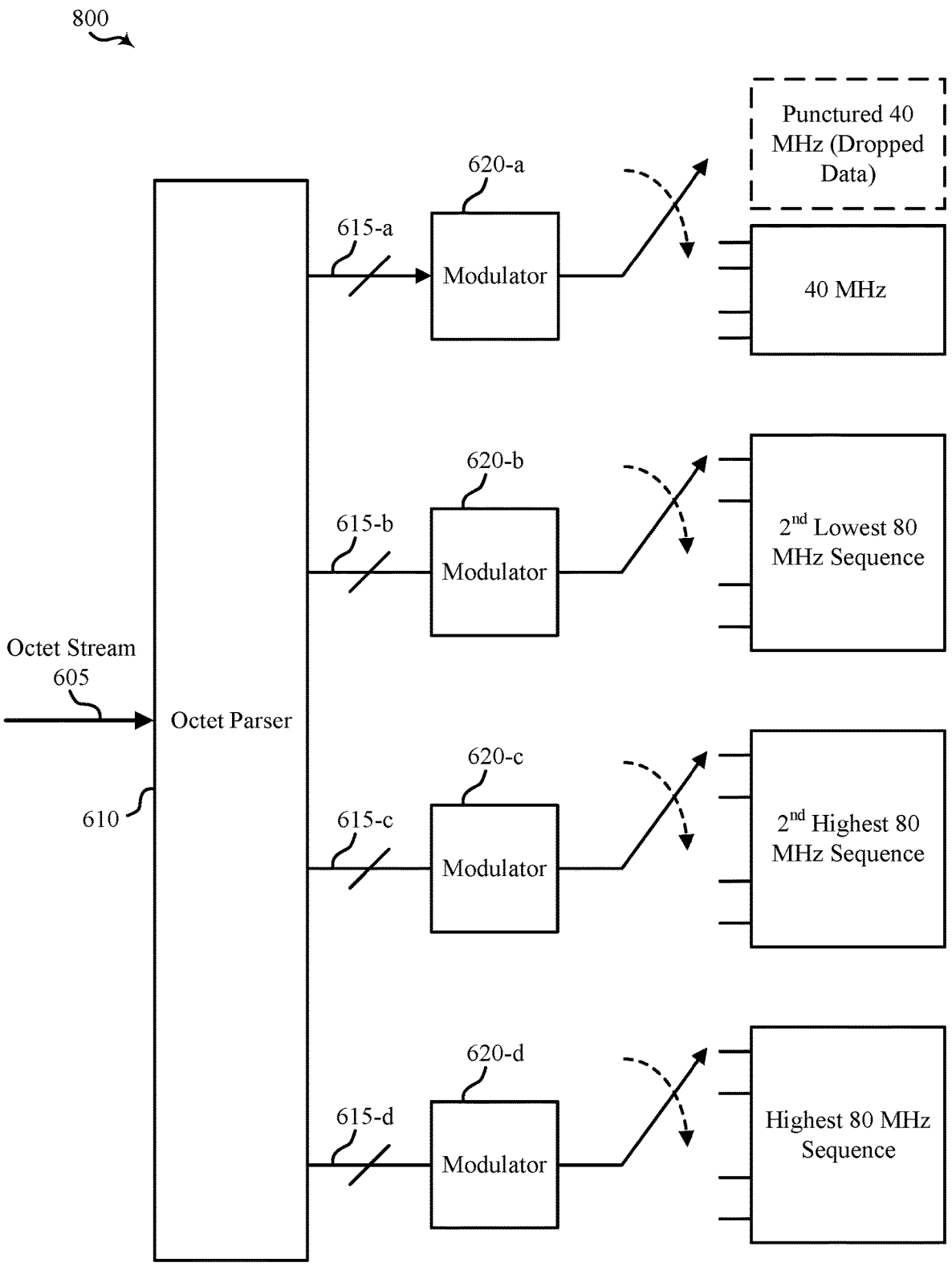

FIG. 8 shows an example segmentation diagram 800 that supports ranging NDPs for wide bandwidth networks in accordance with one or more aspects of the present disclosure. The segmentation diagram 800 may support a transmission or reception technique for ranging NDPs that use a 320 MHz bandwidth and may support a use of EHT ranging NDPs with secure EHT-LTFs. For example, the wireless device 505 and the wireless device 510 may use a counter mode (e.g., an AES-128 counter mode) in the PHY layer to generate a pseudo random sequence of octets at both the transmitter and the receiver and may use the pseudo random sequence of octets for one or more ranging NDPs.

In some aspects, the wireless device 505 and the wireless device 510 may employ the segmentation in accordance with the segmentation diagram 700 if parsing a pseudo random octet stream when a single 80 MHz segment is punctured, and the wireless device 505 and the wireless device 510 may use the segmentation diagram 800 to handle a case in which one or more 40 MHz segments (within one or more 80 MHz segments) are punctured. In accordance with the segmentation diagram 800, the wireless device 505 and the wireless device 510 may support a design of the segmentation diagram 800 to send pseudo random octets to three 80 MHz segments and a 40 MHz segment.

In some implementations, for example, a transmitting device may parse the pseudo random octet stream 605 using a 1:4 octet parser 610 to obtain four outputs 615 (e.g., as similarly illustrated by the segmentation diagrams 600 and 700) and, to obtain a 40 MHz puncturing, the transmitting device may drop any remaining octets of an output 615 once a set of (e.g., all) frequency domain tones of a 40 MHz portion of an 80 MHz segment have been populated with information from the output 615. This process may work and ensure compatibility between a transmitter and a receiver because the transmitter and the receiver use the pseudo random octet stream 605 having the same octets (e.g., same information may be allocated or expected at the 40 MHz portion at both the transmitter and the receiver due to the transmitter and the receiver using the same octet stream 605 and the same octet parser 610). In other words, the wireless device 505 and the wireless device 510 may use a relatively large supply of pseudo random octets and may support a procedure according to which the same octets are mapped to the same subcarriers or tones at both the transmitter and the receiver. As such, the transmitter and the receiver may maintain synchronization as long as both devices are aware of the puncturing pattern and drop one or more octets corresponding to the punctured frequency range. In accordance with such an information dropping-based approach to puncturing a 40 MHz segment, the wireless device 505 and the wireless device 510 may support a unified low-complexity technique for supporting various punctured modes (e.g., punctured modes involving one or more 80 MHz punctured segments, one or more 40 MHz punctured segments, or any combination thereof).

For example, and as illustrated by the segmentation diagram 800, a transmitting device may allocate information of the modulated output 615-a to a first 80 MHz sequence segment, may allocate information of the modulated output

615-b to a second 80 MHz sequence segment, may allocate information of the modulated output 615-c to a third 80 MHz sequence segment, and may allocate partial information of the modulated output 615-d to a 40 MHz sequence segment of a fourth 80 MHz sequence segment to obtain the 40 MHz puncturing. In some aspects, the transmitting device may allocate the partial information of the modulated output 615-d (and drop remaining information of the modulated output 615-d) to frequency domain tones associated with index values ranging from 244 to −244 in the 40 MHz sequence. Further, although the segmentation diagram 800 illustrates the punctured 40 MHz in the fourth 80 MHz sequence segment, the wireless device 505 and the wireless device 510 may additionally, or alternatively, support a 40 MHz puncturing in any one or more of the first 80 MHz sequence segment, the second 80 MHz sequence segment, or the third 80 MHz sequence segment. Further, within any 80 MHz sequence segment, the punctured 40 MHz may occupy a relatively highest frequency range of the 80 MHz sequence segment, a relatively lowest frequency range of the 80 MHz sequence segment, or a frequency range approximately in the middle of the 80 MHz sequence segment.

Figure 9:
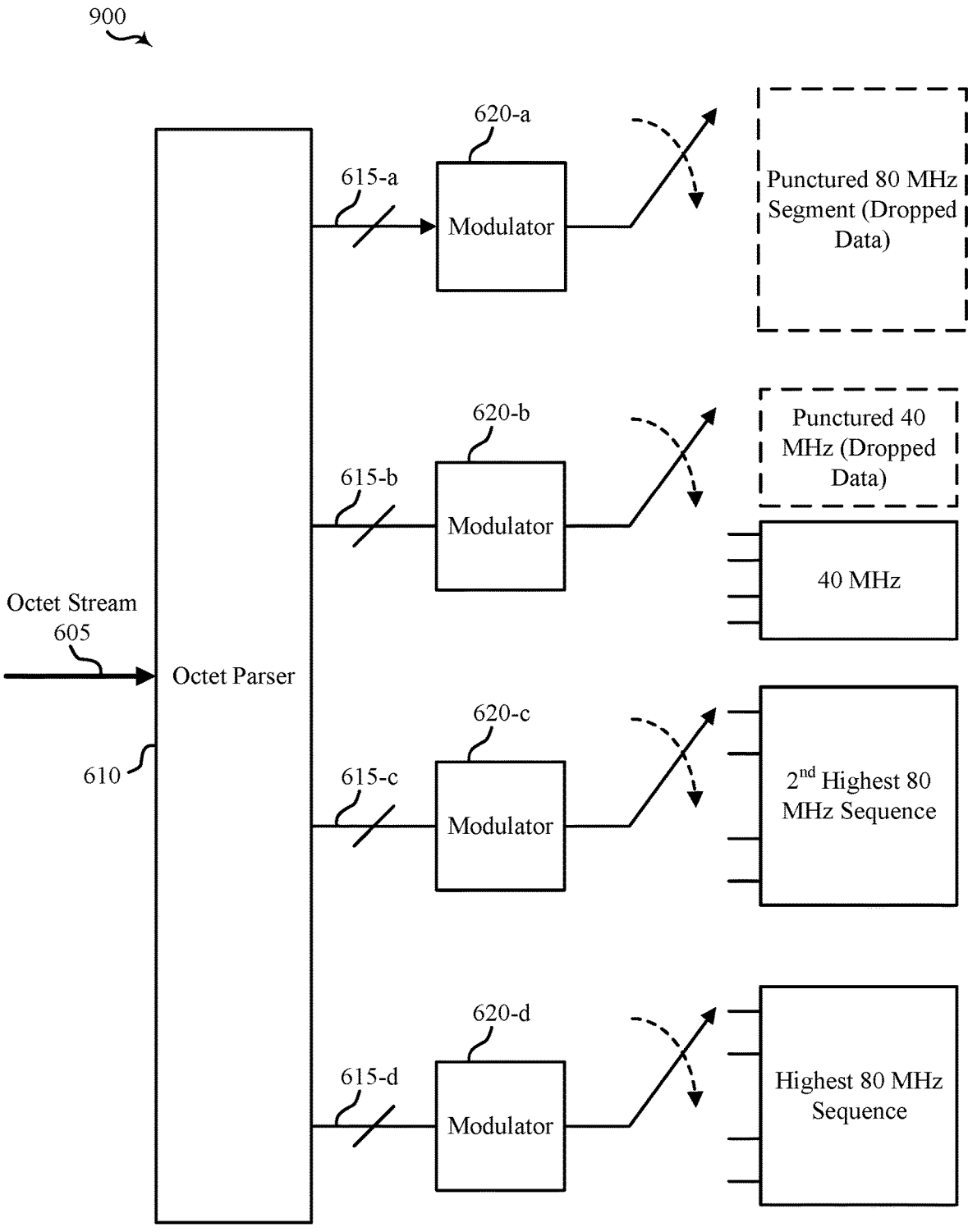

FIG. 9 shows an example segmentation diagram 900 that supports ranging NDPs for wide bandwidth networks in accordance with one or more aspects of the present disclosure. The segmentation diagram 900 may support a transmission or reception technique for ranging NDPs that use a 320 MHz bandwidth and may support a use of EHT ranging NDPs with secure EHT-LTFs. For example, the wireless device 505 and the wireless device 510 may use a counter mode (e.g., an AES-128 counter mode) in the PHY layer to generate a pseudo random sequence of octets at both the transmitter and the receiver and may use the pseudo random sequence of octets for one or more ranging NDPs.

In some aspects, the wireless device 505 and the wireless device 510 may employ the segmentation in accordance with the segmentation diagram 900 if parsing a pseudo random octet stream when an 80 MHz segment and a 40 MHz segment are punctured. Thus, the wireless device 505 and the wireless device 510 may support a design of the segmentation diagram 900 to send pseudo random octets to two 80 MHz segments and a 40 MHz segment.

In some implementations, for example, a transmitting device may parse the pseudo random octet stream 605 using a 1:4 octet parser 610 to obtain four outputs 615 (e.g., as similarly illustrated by the segmentation diagrams 600, 700, and 800) and, to obtain the 80 MHz+40 MHz puncturing, the transmitting device may drop any remaining octets of an output 615 once a set of (e.g., all) frequency domain tones of a 40 MHz portion of an 80 MHz segment have been populated with information from the output 615 and may completely drop octets of an output 615 associated with the punctured 80 MHz segment. This process may ensure compatibility between a transmitter and a receiver because the transmitter and the receiver use the pseudo random octet stream 605 having the same octets (e.g., same information may be allocated or expected at the punctured (e.g., dropped) and actually transmitted portions at both the transmitter and the receiver due to the transmitter and the receiver using the same octet stream 605 and the same octet parser 610).

Figure 10:
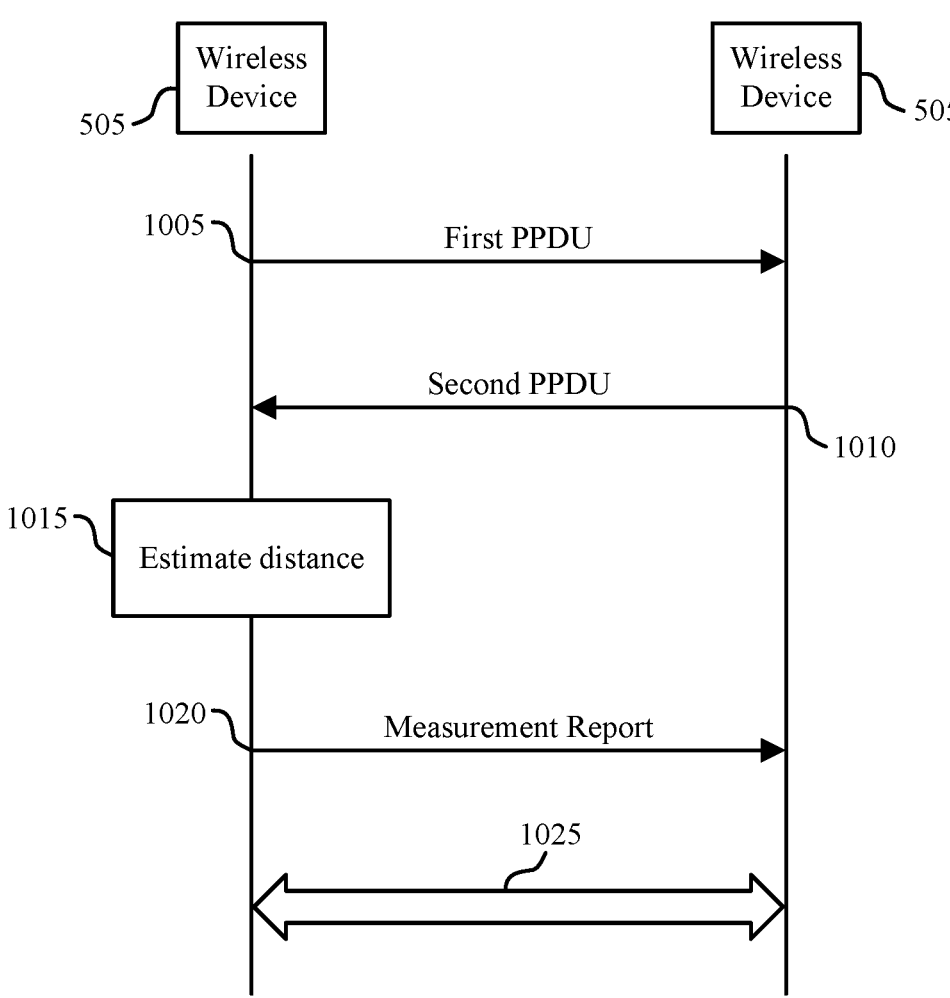
FIG. 10 shows an example signal diagram that supports ranging NDPs for wide bandwidth networks in accordance with one or more aspects of the present disclosure.

FIG. 10 shows an example signal diagram 1000 that supports ranging NDPs for wide bandwidth networks in accordance with one or more aspects of the present disclosure. The signal diagram 1000 may implement or be implemented to realize or facilitate aspects of the WLAN 100, the PDU 200, the PPDU 350, the PPDU 400, the diagram 500, or any one or more of the segmentation diagrams 600, 700, 800, or 900. For example, the signal diagram 1000 illustrates communication between a wireless device 505 and a wireless device 510, which may be examples of corresponding devices described herein. The wireless device 505 and the wireless device 510 may be examples of two STAs 104, two APs 102, or one STA 104 and one AP 102. In some implementations, the wireless device 505 and the wireless device 510 may support an indication or identification of a 320 MHz ranging NDP within a preamble of the PPDU including the 320 MHz ranging NDP.

In the following description of the signal diagram 1000, the operations may be performed (such as reported or provided) in a different order than the order shown, or the operations performed by the example devices may be performed in different orders or at different times. For example, specific operations also may be left out of the signal diagram 1000, or other operations may be added to the signal 1000. Further, although some operations or signaling may be shown to occur at different times for discussion purposes, these operations may actually occur at the same time.

At 1005, the wireless device 505 (e.g., a first wireless device) may transmit a first PPDU (e.g., a first physical layer PDU), where the first PPDU may be associated with a bandwidth that is greater than 160 MHz and where a preamble of the first PPDU includes a first set of bits that indicates that the first PPDU is a first ranging NDP. For example, the first PPDU may be associated with a bandwidth of 320 MHz and may include the first set of bits in a U-SIG field of the preamble of the first PPDU. The first set of bits may include one or more reserved bits of the U-SIG field and the one or more reserved bits may be located or positioned (in terms of bit placement) within one or more of multiple parts of the U-SIG field. For example, the wireless device 505 may use one or more reserved bits of a first part of the U-SIG field (e.g., U-SIG-1) or one or more reserved bits of a second part of the U-SIG field (e.g., U-SIG-2) to indicate that the first PPDU is the first ranging NDP.

In some aspects, the one or more reserved bits used by the wireless device 505 may be designated, at least for a type of STA that is different from a type of the wireless device 505, as either one or more disregard bits or one or more validate bits. For example, in accordance with the described techniques, the wireless device 505 may interpret the one or more reserved bits as the indication that the first PPDU is a 320 MHz ranging NDP while one or more other devices may interpret the one or more reserved bits as one or more disregard bits or one or more validate bits.

Additionally, or alternatively, the one or more bits in the U-SIG field of the preamble of the first PPDU may include one or more bits of a type and compression mode field of the U-SIG field. As such, the wireless device 505 may use the one or more bits of the type and compression mode field of the U-SIG field for indicating that the first PPDU is the first ranging NDP. In such implementations, a word value of the one or more bits of the type and compression mode field may indicate that the first PPDU is the first ranging NDP, where the word value is indicative, at least for a type of STA that is different from the type of the wireless device 505, of a validate indication. In some aspects, the word value of the type and compression mode field may be a value of two or three.

As such, the wireless device 505 may use one or more bits of a U-SIG field or of a type and compression mode field to indicate that the first PPDU is a ranging NDP (e.g., a 320 MHz ranging NDP). As described herein, a use of one or more bits of a given field may be equivalently referred to or understood as a setting of the one or more bits to one or more specific values, a configuring of the one or more bits to one or more specific values, an encoding of the one or more bits to one or more specific values, a selecting of the one or more bits or of the field including the one or more bits, or any combination thereof. Such one or more specific values may include a specific permutation of bit values that indicate information, and the wireless device 505 may use, set, configure, encode, or select the one or more bits such that a receiving device (e.g., the wireless device 510) is able to identify, determine, or otherwise ascertain the information.

In some aspects, a type of a device may refer to which communication protocol a device supports, a capability of a device, or whether a device is configured with an interpretation rule associated with interpreting the one or more reserved bits as the indication that the first PPDU is a 320 MHz ranging NDP. The first PPDU may be a TB PPDU or a non-TB PPDU.

At 1010, the wireless device 505 may receive, from the wireless device 510, a second PPDU, where the second PPDU is associated with a bandwidth that is greater than 160 MHz (e.g., 320 MHz) and where a preamble of the second PPDU includes a second set of bits that indicates that the second PPDU is a second ranging NDP. The second set of bits may indicate that the second PPDU is the second ranging NDP in any of the same ways that the first set of bits may indicate that the first PPDU is the first ranging NDP. For example, the wireless device 505 and the wireless device 510 may support a same interpretation rule associated with how a specific set of bits in a preamble of a PPDU can indicate that the PPDU is a ranging NDP or is not a ranging NDP. The second PPDU may be a TB PPDU or a non-TB PPDU. Such an interpretation rule may be a network-specific rule, such as a rule set forth by a network specification. Additionally, or alternatively, such an interpretation rule may be signaled between the wireless device 505 and the wireless device 510. In some aspects, the transmission of the second PPDU may be triggered by the reception of the first PPDU. Accordingly, the wireless device 505 may interpret the second set of bits in the preamble of the second PPDU to identify, determine, or otherwise ascertain that the second PPDU is a ranging NDP (e.g., a 320 MHz ranging NDP). As described herein, an interpreting of a set of bits may be equivalently referred to or understood as a reading of the set of bits, a decoding of the set of bits, a mapping of the set of bits to a set of actions or definitions (e.g., via a table), or any combination thereof. In some other aspects, a reception of the second PPDU may trigger transmission of the first PPDU.

At 1015, the wireless device 505 may estimate, measure, calculate, or otherwise determine a distance between the wireless device 505 and the wireless device 510 based on the first PPDU and the second PPDU. For example, the wireless device 505 may estimate, measure, calculate, or otherwise determine a distance between the wireless device 505 and the wireless device 510 based on an RTT associated with the first PPDU and the second PPDU.

At 1020, the wireless device 505 may transmit, to the wireless device 510, a measurement report. In some aspects, the measurement report may be based on the transmission of the first PPDU and the reception of the second PPDU and may include an indication of the distance between the wireless device 505 and the wireless device 510. Alternatively, the wireless device 510 may estimate the distance between the wireless device 505 and the wireless device 510 and may transmit the measurement report to the wireless device 505.

At 1025, the wireless device 505 and the wireless device 510 may communicate in association with the measurement report. For example, the wireless device 505 and the wireless device 510 may exchange signaling that is based on performing a ranging measurement procedure or based on the information included in the measurement report. For example, the wireless device 505 and the wireless device 510 may set or configure one or more transmission or reception parameters based on the distance between the wireless device 505 and the wireless device 510.

FIG. 11 shows a flowchart illustrating an example process 1100 performable by a wireless communication device that supports ranging NDPs for wide bandwidth networks in accordance with one or more aspects of the present disclosure. The operations of the process 1100 may be implemented by an AP or an STA or its components as described herein. For example, the operations of the process 1100 may be performed by an AP or an STA as described herein. In some examples, an AP or an STA may execute a set of instructions to control the functional elements of the AP or the STA to perform the described functions. Additionally, or alternatively, the AP or the STA may perform aspects of the described functions using special-purpose hardware.

At 1102, the method may include transmitting a first physical layer PDU, where the first physical layer PDU is associated with a bandwidth that is greater than 160 MHz, and where a preamble of the first physical layer PDU includes a first set of bits that indicates that the first physical layer PDU is a first ranging NDP. The operations of 1102 may be performed in accordance with examples as disclosed herein, such as at 1005 of FIG. 10. In some examples, aspects of the operations of 1102 may be performed by a PPDU transmission component 1402 as described with reference to FIG. 14.

At 1104, the method may include receiving a second physical layer PDU, where the second physical layer PDU is associated with the bandwidth that is greater than 160 MHz, and where a preamble of the second physical layer PDU includes a second set of bits that indicates that the second physical layer PDU is a second ranging NDP. The operations of 1104 may be performed in accordance with examples as disclosed herein, such as at 1010 of FIG. 10. In some examples, aspects of the operations of 1104 may be performed by a PPDU reception component 1404 as described with reference to FIG. 14.

FIG. 12 illustrates a flowchart illustrating an example process 1200 performable by a wireless communication device that supports ranging NDPs for wide bandwidth networks in accordance with one or more aspects of the present disclosure. The operations of the process 1200 may be implemented by an AP or an STA or its components as described herein. For example, the operations of the process 1200 may be performed by an AP or an STA as described herein. In some examples, an AP or an STA may execute a set of instructions to control the functional elements of the AP or the STA to perform the described functions. Additionally, or alternatively, the AP or the STA may perform aspects of the described functions using special-purpose hardware.

At 1202, the method may include including a first set of bits in a U-SIG field of a preamble of a first physical layer PDU. For example, the wireless communication device may configure the U-SIG field with the first set of bits such that the U-SIG field includes or otherwise indicates the first set of bits. The operations of 1202 may be performed in accordance with examples as disclosed herein, such as at or prior to 1005 of FIG. 10. In some examples, aspects of the operations of 1202 may be performed by a PPDU preamble generation component 1406 as described with reference to FIG. 14.

At 1204, the method may include transmitting the first physical layer PDU, where the first physical layer PDU is associated with a bandwidth that is greater than 160 MHz, and where the preamble of the first physical layer PDU includes the first set of bits that indicates that the first physical layer PDU is a first ranging NDP. The operations of 1204 may be performed in accordance with examples as disclosed herein, such as at 1005 of FIG. 10. In some examples, aspects of the operations of 1204 may be performed by a PPDU transmission component 1402 as described with reference to FIG. 14.

At 1206, the method may include receiving a second physical layer PDU, where the second physical layer PDU is associated with the bandwidth that is greater than 160 MHz, and where a preamble of the second physical layer PDU includes a second set of bits that indicates that the second physical layer PDU is a second ranging NDP. The operations of 1206 may be performed in accordance with examples as disclosed herein, such as at 1010 of FIG. 10. In some examples, aspects of the operations of 1206 may be performed by a PPDU reception component 1404 as described with reference to FIG. 14.

FIG. 13 illustrates a flowchart illustrating an example process 1300 performable by a wireless communication device that supports ranging NDPs for wide bandwidth networks in accordance with one or more aspects of the present disclosure. The operations of the process 1300 may be implemented by an AP or an STA or its components as described herein. For example, the operations of the process 1300 may be performed by an AP or an STA as described herein. In some examples, an AP or an STA may execute a set of instructions to control the functional elements of the AP or the STA to perform the described functions. Additionally, or alternatively, the AP or the STA may perform aspects of the described functions using special-purpose hardware.

At 1302, the method may include transmitting a first physical layer PDU, where the first physical layer PDU is associated with a bandwidth that is greater than 160 MHz, and where a preamble of the first physical layer PDU includes a first set of bits that indicates that the first physical layer PDU is a first ranging NDP. The operations of 1302 may be performed in accordance with examples as disclosed herein, such as at 1005 of FIG. 10. In some examples, aspects of the operations of 1302 may be performed by a PPDU transmission component 1402 as described with reference to FIG. 14.

At 1304, the method may include receiving a second physical layer PDU, where the second physical layer PDU is associated with the bandwidth that is greater than 160 MHz, and where a preamble of the second physical layer PDU includes a second set of bits that indicates that the second physical layer PDU is a second ranging NDP. The operations of 1304 may be performed in accordance with examples as disclosed herein, such as at 1010 of FIG. 10. In some examples, aspects of the operations of 1304 may be performed by a PPDU reception component 1404 as described with reference to FIG. 14.

At 1306, the method may include communicating in association with a measurement report, where the measurement report is based on transmission of the first physical layer PDU and reception of the second physical layer PDU, and where the measurement report includes an indication of a distance between the first wireless communication device and a second wireless communication device from which the second physical layer PDU is received. In some implementations, such communication may include transmitting or receiving the measurement report. Additionally, or alternatively, such communication may include transmitting or receiving other messages or frames based on measurements (e.g., the distance) indicated in the measurement report. For example, the communication may include beamformed (e.g., directional) transmission or reception, where such beamforming is based on the distance indicated in the measurement report. The operations of 1306 may be performed in accordance with examples as disclosed herein, such as at 1020 or 1025, or both, of FIG. 10. In some examples, aspects of the operations of 1306 may be performed by a ranging component 1410 as described with reference to FIG. 14.

Figure 14:
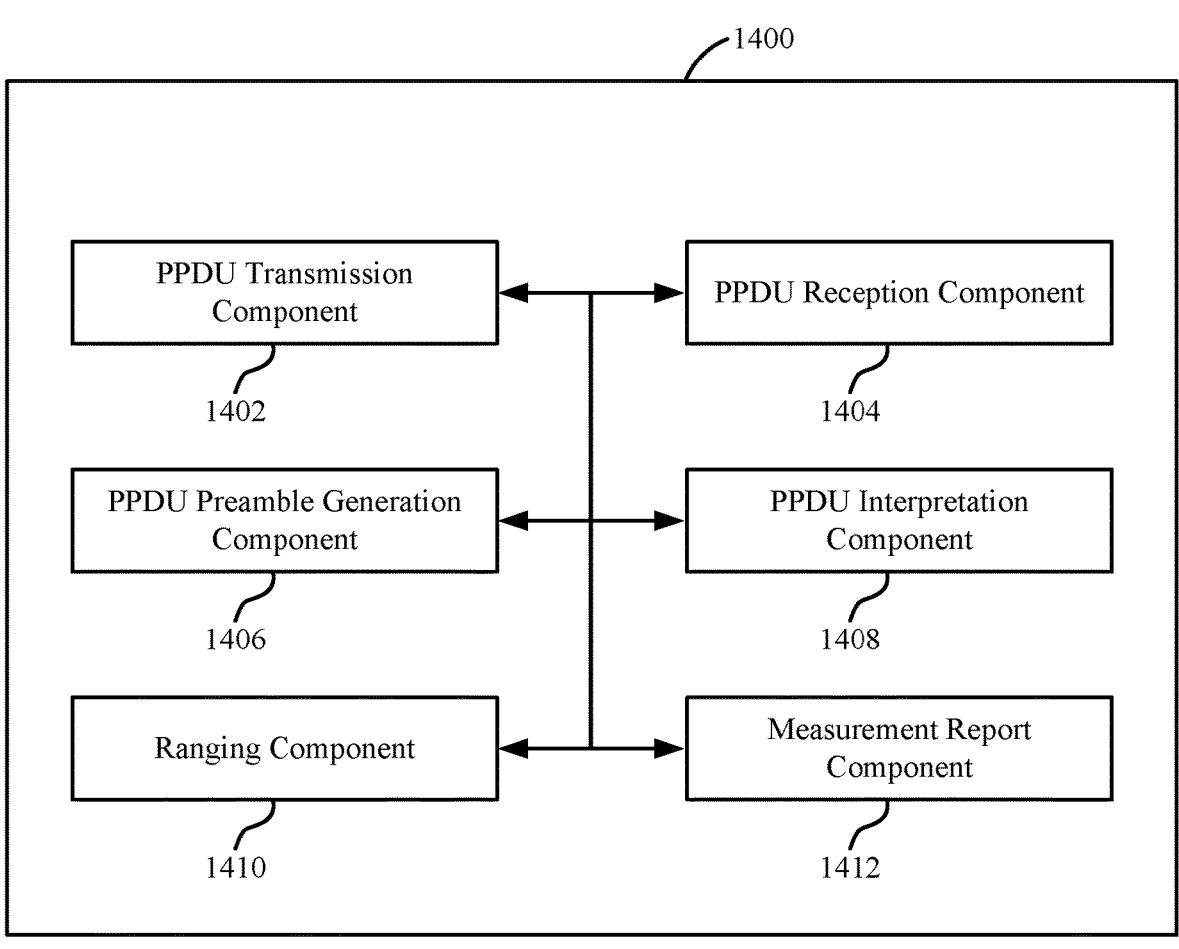
FIG. 14 shows a block diagram of an example wireless communication device that supports ranging NDPs for wide bandwidth networks in accordance with one or more aspects of the present disclosure.

FIG. 14 shows a block diagram of an example wireless communication device 1400 that supports ranging NDPs for wide bandwidth networks according to some aspects of the present disclosure. In some examples, the wireless communication device 1400 is configured or operable to perform the processes 1100, 1200, and 1300 as described with reference to FIGS. 11, 12, and 13, respectively. In various examples, the wireless communication device 1400 can be a chip, SoC, chipset, package or device that may include: one or more modems (such as a Wi-Fi (IEEE 802.11) modem or a cellular modem such as 3GPP 4G LTE or 5G compliant modem); one or more processors, processing blocks or processing elements (collectively "the processor"); one or more radios (collectively "the radio"); and one or more memories or memory blocks (collectively "the memory").

In some examples, the wireless communication device 1400 can be a device for use in an AP or a STA, such as AP 102 or a STA 104 as described with reference to FIG. 1. In some other examples, the wireless communication device 1400 can be an AP that includes such a chip, SoC, chipset, package or device as well as multiple antennas. The wireless communication device 1400 is capable of transmitting and receiving wireless communications in the form of, for example, wireless packets. For example, the wireless communication device can be configured or operable to transmit and receive packets in the form of physical layer PPDUs and MPDUs conforming to one or more of the IEEE 802.11 family of wireless communication protocol standards. In some examples, the wireless communication device 1400 also includes or can be coupled with an application processor which may be further coupled with another memory. In some examples, the wireless communication device 1400 further includes at least one external network interface that enables communication with a core network or backhaul network to gain access to external networks including the Internet. In some examples, the wireless communication device 1400 further includes a user interface (UI) (such as a touchscreen or keypad) and a display, which may be integrated with the UI to form a touchscreen display. In some examples, the wireless communication device 1400 may further include one or more sensors such as, for example, one or more inertial sensors, accelerometers, temperature sensors, pressure sensors, or altitude sensors.

The wireless communication device 1400 includes a PPDU transmission component 1402, a PPDU reception component 1404, a PPDU preamble generation component 1406, a PPDU interpretation component 1408, a ranging component 1410, and a measurement report component 1412. Portions of one or more of the components 1402, 1404, 1406, 1408, 1410, and 1412 may be implemented at least in part in hardware or firmware. For example, the PPDU reception component 1404 may be implemented at least in part by a modem. In some examples, at least some of the components 1402, 1404, 1406, 1408, 1410 and 1412 are implemented at least in part by a processor and as software stored in a memory. For example, portions of one or more of the components 1402, 1404, 1406, 1408, 1410 or 1412 can be implemented as non-transitory instructions (or "code") executable by the processor to perform the functions or operations of the respective module.

In some implementations, the processor may be a component of a processing system. A processing system may generally refer to a system or series of machines or components that receives inputs and processes the inputs to produce a set of outputs (which may be passed to other systems or components of, for example, the device 1400). For example, a processing system of the device 1400 may refer to a system including the various other components or subcomponents of the device 1400, such as the processor, or a transceiver, or a communications manager, or other components or combinations of components of the device 1400. The processing system of the device 1400 may interface with other components of the device 1400, and may process information received from other components (such as inputs or signals) or output information to other components. For example, a chip or modem of the device 1400 may include a processing system, a first interface to output information and a second interface to obtain information. In some implementations, the first interface may refer to an interface between the processing system of the chip or modem and a transmitter, such that the device 1400 may transmit information output from the chip or modem. In some implementations, the second interface may refer to an interface between the processing system of the chip or modem and a receiver, such that the device 1400 may obtain information or signal inputs, and the information may be passed to the processing system. A person having ordinary skill in the art will readily recognize that the first interface also may obtain information or signal inputs, and the second interface also may output information or signal outputs.

The PPDU transmission component 1402 may be configured as or otherwise support a means for transmitting a first physical layer PDU, where the first physical layer PDU is associated with a bandwidth that is greater than 160 MHz, and where a preamble of the first physical layer PDU includes a first set of bits that indicates that the first physical layer PDU is a first ranging NDP. The PPDU reception component 1404 may be configured as or otherwise support a means for receiving a second physical layer PDU, where the second physical layer PDU is associated with the bandwidth that is greater than 160 MHz, and where a preamble of the second physical layer PDU includes a second set of bits that indicates that the second physical layer PDU is a second ranging NDP.

In some examples, the PPDU preamble generation component 1406 may be configured as or otherwise support a means for including the first set of bits in a U-SIG field of the preamble of the first physical layer PDU.

In some examples, to support including the first set of bits in the U-SIG field of the preamble of the first physical layer PDU, the PPDU preamble generation component 1406 may be configured as or otherwise support a means for using one or more reserved bits of the U-SIG field for indicating that the first physical layer PDU is the first ranging NDP, the one or more reserved bits being within one or more of multiple parts of the U-SIG field and being designated, at least for a first type of STA that is different from a type of the first wireless communication device, as either one or more disregard bits or one or more validate bits.

In some examples, to support including the first set of bits in the U-SIG field of the preamble of the first physical layer PDU, the PPDU preamble generation component 1406 may be configured as or otherwise support a means for using one or more bits of a type and compression mode field of the U-SIG field for indicating that the first physical layer PDU is the first ranging NDP.

In some examples, a word value of the one or more bits of the type and compression mode field indicates that the first physical layer PDU is the first ranging NDP, the word value being indicative, at least for a first type of STA that is different from a type of the first wireless communication device, of a validate indication. In some examples, the word value of the one or more bits of the type and compression mode field is two or three.

In some examples, the PPDU interpretation component 1408 may be configured as or otherwise support a means for interpreting the second set of bits in the preamble of the second physical layer PDU in accordance with a network-specific rule, where the second set of bits indicates that the second physical layer PDU is the second ranging NDP in accordance with the network-specific rule.

In some examples, the ranging component 1410 may be configured as or otherwise support a means for communicating in association with a measurement report, where the measurement report is based on transmission of the first physical layer PDU and reception of the second physical layer PDU, and where the measurement report includes an indication of a distance between the first wireless communication device and a second wireless communication device from which the second physical layer PDU is received.

In some examples, the measurement report component 1412 may be configured as or otherwise support a means for transmitting the measurement report to the second wireless communication device. In some examples, the measurement report component 1412 may be configured as or otherwise support a means for receiving the measurement report from the second wireless communication device.

In some examples, the first set of bits indicates that the first physical layer PDU is the first ranging NDP and that the first physical layer PDU is associated with the bandwidth that is greater than 160 MHz. In some examples, the second set of bits indicates that the second physical layer PDU is the second ranging NDP and that the second physical layer PDU is associated with the bandwidth that is greater than 160 MHz.

In some examples, the first physical layer PDU is a trigger-based physical layer PDU or a non-trigger-based physical layer PDU. In some examples, the second physical layer PDU is triggered by the first physical layer PDU. In some examples, transmitting the first physical layer PDU and receiving the second physical layer PDU is part of a ranging measurement procedure between the first wireless communication device and a second wireless communication device. In some examples, the bandwidth is equal to 320 MHz.

Implementation examples are described in the following numbered clauses:

Clause 1: A method for wireless communication performable at a first wireless communication device, comprising: transmitting a first physical layer PDU, wherein the first physical layer PDU is associated with a bandwidth that is greater than 160 MHz, and wherein a preamble of the first physical layer PDU includes a first set of bits that indicates that the first physical layer PDU is a first ranging NDP; and receiving a second physical layer PDU, wherein the second physical layer PDU is associated with the bandwidth that is greater than 160 MHz, and wherein a preamble of the second physical layer PDU includes a second set of bits that indicates that the second physical layer PDU is a second ranging NDP.

Clause 2: The method of clause 1, further comprising: including the first set of bits in a U-SIG field of the preamble of the first physical layer PDU.

Clause 3: The method of clause 2, wherein including the first set of bits in the U-SIG field of the preamble of the first physical layer PDU further comprises: using one or more reserved bits of the U-SIG field for indicating that the first physical layer PDU is the first ranging NDP, the one or more reserved bits being within one or more of multiple parts of the U-SIG field and being designated, at least for a first type of STA that is different from a type of the first wireless communication device, as either one or more disregard bits or one or more validate bits.

Clause 4: The method of any of clauses 2 through 3, wherein including the first set of bits in the U-SIG field of the preamble of the first physical layer PDU further comprises: using one or more bits of a type and compression mode field of the U-SIG field for indicating that the first physical layer PDU is the first ranging NDP.

Clause 5: The method of clause 4, wherein a word value of the one or more bits of the type and compression mode field indicates that the first physical layer PDU is the first ranging NDP, the word value being indicative, at least for a first type of STA that is different from a type of the first wireless communication device, of a validate indication.

Clause 6: The method of clause 5, wherein the word value of the one or more bits of the type and compression mode field is two or three.

Clause 7: The method of any of clauses 1 through 6, further comprising: interpreting the second set of bits in the preamble of the second physical layer PDU in accordance with a network-specific rule, wherein the second set of bits indicates that the second physical layer PDU is the second ranging NDP in accordance with the network-specific rule.

Clause 8: The method of any of clauses 1 through 7, further comprising: communicating in association with a measurement report, wherein the measurement report is based at least in part on transmission of the first physical layer PDU and reception of the second physical layer PDU, and wherein the measurement report includes an indication of a distance between the first wireless communication device and a second wireless communication device from which the second physical layer PDU is received.

Clause 9: The method of clause 8, further comprising: transmitting the measurement report to the second wireless communication device; or receiving the measurement report from the second wireless communication device.

Clause 10: The method of any of clauses 1 through 9, wherein the first set of bits indicates that the first physical layer PDU is the first ranging NDP and that the first physical layer PDU is associated with the bandwidth that is greater than 160 MHz, and the second set of bits indicates that the second physical layer PDU is the second ranging NDP and that the second physical layer PDU is associated with the bandwidth that is greater than 160 MHz.

Clause 11: The method of any of clauses 1 through 10, wherein the first physical layer PDU is a trigger-based physical layer PDU or a non-trigger-based physical layer PDU.

Clause 12: The method of any of clauses 1 through 11, wherein the second physical layer PDU is triggered by the first physical layer PDU.

Clause 13: The method of any of clauses 1 through 12, wherein transmitting the first physical layer PDU and receiving the second physical layer PDU is part of a ranging measurement procedure between the first wireless communication device and a second wireless communication device.

Clause 14: The method of any of clauses 1 through 13, wherein the bandwidth is equal to 320 MHz.

Clause 15: An apparatus for wireless communication at a first wireless communication device, comprising a processor; memory coupled with the processor; and instructions stored in the memory and executable by the processor to cause the apparatus to perform a method of any of clauses 1 through 14.

Clause 16: An apparatus for wireless communication at a first wireless communication device, comprising at least one means for performing a method of any of clauses 1 through 14.

Clause 17: A non-transitory computer-readable medium storing code for wireless communication at a first wireless communication device, the code comprising instructions executable by a processor to perform a method of any of clauses 1 through 14.

As used herein, the term "determine" or "determining" encompasses a wide variety of actions and, therefore, "determining" can include calculating, computing, processing, deriving, investigating, looking up (such as via looking up in a table, a database or another data structure), inferring, ascertaining, measuring, and the like. Also, "determining" can include receiving (such as receiving information), accessing (such as accessing data stored in memory), transmitting (such as transmitting information) and the like. Also, "determining" can include resolving, selecting, obtaining, choosing, establishing and other such similar actions.

As used herein, a phrase referring to "at least one of" a list of items refers to any combination of those items, including single members. As an example, "at least one of: a, b, or c" is intended to cover: a, b, c, a-b, a-c, b-c, and a-b-c. As used herein, "or" is intended to be interpreted in the inclusive sense, unless otherwise explicitly indicated. For example, "a or b" may include a only, b only, or a combination of a and b.

As used herein, "based on" is intended to be interpreted in the inclusive sense, unless otherwise explicitly indicated. For example, "based on" may be used interchangeably with "based at least in part on," "associated with", or "in accordance with" unless otherwise explicitly indicated. Specifically, unless a phrase refers to "based on only 'a,'" or the equivalent in context, whatever it is that is "based on 'a,'" or "based at least in part on 'a,'" may be based on "a" alone or based on a combination of "a" and one or more other factors, conditions or information.

The various illustrative components, logic, logical blocks, modules, circuits, operations and algorithm processes described in connection with the examples disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the examples described in this disclosure may be readily apparent to persons having ordinary skill in the art, and the generic principles defined herein may be applied to other examples without departing from the spirit or scope of this disclosure. Thus, the claims are not intended to be limited to the examples shown herein, but are to be accorded the widest scope consistent with this disclosure, the principles and the novel features disclosed herein.

Additionally, various features that are described in this specification in the context of separate examples also can be implemented in combination in a single implementation. Conversely, various features that are described in the context of a single implementation also can be implemented in multiple examples separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

What is claimed is:

1. A method for wireless communication performable at a first wireless communication device, comprising:

transmitting a first physical layer protocol data unit, wherein the first physical layer protocol data unit is associated with a bandwidth that is greater than 160 megahertz (MHz), wherein a first preamble of the first physical layer protocol data unit includes a first universal signal (U-SIG) field, wherein the first U-SIG field includes a first set of bits that indicates that the first physical layer protocol data unit is a first ranging null data packet, and wherein the first set of bits comprises:

one or more reserved bits that are designated as either one or more disregard bits or one or more validate bits, or one or more bits of a type and compression mode field; and receiving a second physical layer protocol data unit, wherein the second physical layer protocol data unit is associated with the bandwidth that is greater than 160 MHz, wherein a second preamble of the second physical layer protocol data unit includes a second U-SIG field, and wherein the second U-SIG field includes a second set of bits that indicates that the second physical layer protocol data unit is a second ranging null data packet.

2. The method of claim 1, wherein the first set of bits comprises the one or more reserved bits, the one or more reserved bits being within one or more of multiple parts of the first U-SIG field and being designated, at least for a first type of station (STA) that is different from a type of the first wireless communication device, as either the one or more disregard bits or the one or more validate bits.

3. The method of claim 1, wherein the first set of bits comprises the one or more bits of the type and compression mode field, and wherein a word value of the one or more bits of the type and compression mode field indicates that the first physical layer protocol data unit is the first ranging null data packet, the word value being indicative, at least for a first type of station (STA) that is different from a type of the first wireless communication device, of a validate indication.

4. The method of claim 3, wherein the word value of the one or more bits of the type and compression mode field is two or three.

5. The method of claim 1, further comprising:

interpreting the second set of bits in the second U-SIG field of the second preamble of the second physical layer protocol data unit in accordance with a network-specific rule, wherein the second set of bits indicates that the second physical layer protocol data unit is the second ranging null data packet in accordance with the network-specific rule.

6. The method of claim 1, further comprising:

communicating in association with a measurement report, wherein the measurement report is based at least in part on transmission of the first physical layer protocol data unit and reception of the second physical layer protocol data unit, and wherein the measurement report includes an indication of a distance between the first wireless communication device and a second wireless communication device from which the second physical layer protocol data unit is received.

7. The method of claim 6, further comprising:

transmitting the measurement report to the second wireless communication device; or receiving the measurement report from the second wireless communication device.

8. The method of claim 1, wherein the first set of bits indicates that the first physical layer protocol data unit is the first ranging null data packet and that the first physical layer protocol data unit is associated with the bandwidth that is greater than 160 MHz, and wherein the second set of bits indicates that the second physical layer protocol data unit is the second ranging null data packet and that the second physical layer protocol data unit is associated with the bandwidth that is greater than 160 MHz.

9. The method of claim 1, wherein the first physical layer protocol data unit is a trigger-based physical layer protocol data unit or a non-trigger-based physical layer protocol data unit.

10. The method of claim 1, wherein the second physical layer protocol data unit is triggered by the first physical layer protocol data unit.

11. The method of claim 1, wherein transmitting the first physical layer protocol data unit and receiving the second physical layer protocol data unit is part of a ranging measurement procedure between the first wireless communication device and a second wireless communication device.

12. The method of claim 1, wherein the bandwidth is equal to 320 MHz.

13. The method of claim 1, wherein the second set of bits included in the second U-SIG field of the second preamble of the second physical layer protocol data unit comprises:

one or more second reserved bits that are designated as either one or more second disregard or one or more second validate bits; or one or more second bits of a second type and compression mode field.

14. A first wireless communication device, comprising:

at least one memory; and at least one processor communicatively coupled with the at least one memory, the at least one processor operable to cause the first wireless communication device to:

transmit a first physical layer protocol data unit, wherein the first physical layer protocol data unit is associated with a bandwidth that is greater than 160 megahertz (MHz), wherein a first preamble of the first physical layer protocol data unit includes a first universal signal (U-SIG) field, wherein the first U-SIG field includes a first set of bits that indicates that the first physical layer protocol data unit is a first ranging null data packet, and wherein the first set of bits comprises:

one or more reserved bits that are designated as either one or more disregard or one or more validate bits, or one or more bits of a type and compression mode field; and receive a second physical layer protocol data unit, wherein the second physical layer protocol data unit is associated with the bandwidth that is greater than 160 MHz, wherein a second preamble of the second physical layer protocol data unit includes a second U-SIG field, and wherein the second U-SIG field includes a second set of bits that indicates that the second physical layer protocol data unit is a second ranging null data packet.

15. The first wireless communication device of claim 14, wherein the first set of bits comprises the one or more reserved bits of the first U-SIG field for indicating that the first physical layer protocol data unit is the first ranging null data packet, the one or more reserved bits being within one or more of multiple parts of the first U-SIG field and being designated, at least for a first type of station (STA) that is different from a type of the first wireless communication device, as either the one or more disregard bits or the one or more validate bits.

16. The first wireless communication device of claim 14, wherein the first set of bits comprises the one or more bits of the type and compression mode field, and wherein a word value of the one or more bits of the type and compression mode field indicates that the first physical layer protocol data unit is the first ranging null data packet, the word value being indicative, at least for a first type of station (STA) that is different from a type of the first wireless communication device, of a validate indication.

17. The first wireless communication device of claim 16, wherein the word value of the one or more bits of the type and compression mode field is two or three.

18. The first wireless communication device of claim 14, wherein the at least one processor is further operable to cause the first wireless communication device to:

interpret the second set of bits in the second U-SIG field of the second preamble of the second physical layer protocol data unit in accordance with a network-spe-
cific rule, wherein the second set of bits indicates that
the second physical layer protocol data unit is the
second ranging null data packet in accordance with the
network-specific rule.

19. The first wireless communication device of claim 14,
wherein the at least one processor is further operable to
cause the first wireless communication device to:

communicate in association with a measurement report,
wherein the measurement report be based at least in
part on transmission of the first physical layer protocol
data unit and reception of the second physical layer
protocol data unit, and wherein the measurement report
includes an indication of a distance between the first
wireless communication device and a second wireless
communication device from which the second physical
layer protocol data unit is received.

20. The first wireless communication device of claim 19,
wherein the at least one processor is further operable to
cause the first wireless communication device to:

transmit the measurement report to the second wireless
communication device; or receive the measurement report from the second wireless
communication device.

21. The first wireless communication device of claim 14,
wherein the first set of bits indicates that the first physical
layer protocol data unit is the first ranging null data packet
and that the first physical layer protocol data unit is asso-
ciated with the bandwidth that is greater than 160 MHz, and
wherein the second set of bits indicates that the second
physical layer protocol data unit is the second ranging null
data packet and that the second physical layer protocol data
unit is associated with the bandwidth that is greater than 160
MHz.

22. The first wireless communication device of claim 14,
wherein the first physical layer protocol data unit is a
trigger-based physical layer protocol data unit or a non-
trigger-based physical layer protocol data unit.

23. The first wireless communication device of claim 14,
wherein the second physical layer protocol data unit is
triggered by the first physical layer protocol data unit.

24. The first wireless communication device of claim 14,
wherein, to transmit the first physical layer protocol data unit
and to receive the second physical layer protocol data unit,
the at least one processor is further operable to cause the first
wireless communication device to:

transmit the first physical layer protocol data unit and
receive the second physical layer protocol data unit as
part of a ranging measurement procedure between the
first wireless communication device and a second wire-
less communication device.

25. The first wireless communication device of claim 14,
wherein the bandwidth is equal to 320 MHz.

26. An apparatus for wireless communication at a first
wireless communication device, comprising:

means for transmitting a first physical layer protocol data
unit, wherein the first physical layer protocol data unit
is associated with a bandwidth that is greater than 160
megahertz (MHz), wherein a first preamble of the first
physical layer protocol data unit includes a first uni-
versal signal (U-SIG) field, wherein the first U-SIG
field includes a first set of bits that indicates that the
first physical layer protocol data unit is a first ranging
null data packet, and wherein the first set of bits
comprises:

one or more reserved bits that are designated as either
one or more disregard or validate bits, or one or more bits of a type and compression mode field;
and means for receiving a second physical layer protocol data
unit, wherein the second physical layer protocol data
unit is associated with the bandwidth that is greater
than 160 MHz, wherein a second preamble of the
second physical layer protocol data unit includes a
second U-SIG field, and wherein the second U-SIG
field includes a second set of bits that indicates that the
second physical layer protocol data unit is a second
ranging null data packet.

27. A non-transitory computer-readable medium storing
code for wireless communication at a first wireless commu-
nication device, the code comprising instructions executable
by at least one processor to:

transmit a first physical layer protocol data unit, wherein
the first physical layer protocol data unit is associated
with a bandwidth that is greater than 160 megahertz
(MHz), wherein a first preamble of the first physical
layer protocol data unit includes a first universal signal
(U-SIG) field, wherein the first U-SIG field includes a
first set of bits that indicates that the first physical layer
protocol data unit is a first ranging null data packet, and
wherein the first set of bits comprises:

one or more reserved bits that are designated as either
one or more disregard or validate bits, or one or more bits of a type and compression mode field;
and receive a second physical layer protocol data unit,
wherein the second physical layer protocol data unit is
associated with the bandwidth that is greater than 160
MHz, wherein a second preamble of the second physi-
cal layer protocol data unit includes a second U-SIG
field, and wherein the second U-SIG field includes a
second set of bits that indicates that the second physical
layer protocol data unit is a second ranging null data
packet.

* * * * *